(12) United States Patent
Choi et al.

(10) Patent No.: US 10,868,541 B1
(45) Date of Patent: Dec. 15, 2020

(54) CODE GENERATOR INCLUDING ASYNCHRONOUS COUNTER AND SYNCHRONOUS COUNTER, AND OPERATING METHOD THEREOF

(71) Applicant: Samsung Electronics Co., Ltd., Suwon-si (KR)

(72) Inventors: Wonhyun Choi, Gunpo-si (KR); Minsu Kim, Hwaseong-si (KR); Sungyong Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/686,184

(22) Filed: Nov. 17, 2019

(30) Foreign Application Priority Data

May 30, 2019 (KR) .................. 10-2019-0063868

(51) Int. Cl.
*H03K 23/58* (2006.01)
*H03K 23/40* (2006.01)
*H03M 7/16* (2006.01)

(52) U.S. Cl.
CPC .......... *H03K 23/588* (2013.01); *H03K 23/40* (2013.01); *H03M 7/16* (2013.01)

(58) Field of Classification Search
USPC .......................................................... 341/98
See application file for complete search history.

(56) References Cited

U.S. PATENT DOCUMENTS

| | | | |
|---|---|---|---|
| 5,187,725 A * | 2/1993 | Eguchi .................. | H03K 21/12 377/114 |
| 6,445,760 B1 * | 9/2002 | Weintraub .......... | H03K 23/588 377/118 |
| 6,961,402 B1 | 11/2005 | Younis | |
| 7,071,751 B1 * | 7/2006 | Kaviani .............. | H03K 3/0322 327/263 |
| 7,190,756 B1 * | 3/2007 | Kaviani .............. | H03K 21/023 377/118 |
| 7,702,061 B2 | 4/2010 | Shao et al. | |
| 8,421,891 B2 | 4/2013 | Morikawa et al. | |
| 8,711,016 B2 * | 4/2014 | Kim ....................... | H03M 7/16 341/98 |
| 9,294,099 B2 | 3/2016 | Goyal et al. | |

FOREIGN PATENT DOCUMENTS

JP   H05315944 A   11/1993
JP   2017168969 A   9/2017

* cited by examiner

*Primary Examiner* — Khai M Nguyen
(74) *Attorney, Agent, or Firm* — Muir Patent Law, PLLC

(57) ABSTRACT

A code generator includes an asynchronous counter that includes first to m-th flip-flops configured to asynchronously output first to m-th output signals in response to a first clock signal, the first to m-th output signals corresponding to first to m-th bits (m being an integer of 2 or more) of a code, respectively, and a synchronous counter that includes (m+1)-th to (m+n)-th flip-flops configured to synchronously output (m+1)-th to (m+n)-th output signals in response to the first clock signal, the (m+1)-th to (m+n)-th output signals corresponding to (m+1)-th to (m+n)-th bits (n being an integer of 2 or more) of the code. The asynchronous counter further includes first to m-th delay circuits configured to respectively delay the first to m-th output signals such that the first to m-th bits of the code are output together at the same time when the (m+1)-th to (m+n)-th bits are output.

19 Claims, 16 Drawing Sheets

US 10,868,541 B1

CODE GENERATOR INCLUDING ASYNCHRONOUS COUNTER AND SYNCHRONOUS COUNTER, AND OPERATING METHOD THEREOF

CROSS-REFERENCE TO RELATED APPLICATIONS

This application claims priority under 35 U.S.C. § 119 to Korean Patent Application No. 10-2019-0063868 filed on May 30, 2019, in the Korean Intellectual Property Office, the disclosure of which is incorporated by reference herein in its entirety.

BACKGROUND

Embodiments of the inventive concept disclosed herein relate to a code generator and an operating method thereof, and more particularly, relate to a code generator including an asynchronous counter and a synchronous counter and an operating method thereof.

A counter may receive a clock signal and may perform a counting operation based on the clock signal. The counter may increase or decrease a counting value at a rising edge or a falling edge of the clock signal. The counter may count the number of times that a logical value of the clock signal is changed. The counter may be classified as an asynchronous counter or a synchronous counter. The counter may output a binary code.

The asynchronous counter may receive a clock signal and divide the received clock signal. However, a code that is output from the asynchronous counter may not be synchronized with the received clock signal. In contrast, the synchronous counter may receive a clock signal, and a code that is output by the synchronous counter may be synchronized with the received clock signal. However, the synchronous counter is difficult to operate at a relatively high speed compared with the asynchronous counter.

SUMMARY

Embodiments of the inventive concept provide a code generator including an asynchronous counter and a synchronous counter and an operating method thereof.

According to an exemplary embodiment, a code generator includes an asynchronous counter that includes first to m-th flip-flops configured to asynchronously output first to m-th output signals in response to a first clock signal, the first to m-th output signals corresponding to first to m-th bits (m being an integer of 2 or more) of a code, respectively, and a synchronous counter that includes (m+1)-th to (m+n)-th flip-flops configured to synchronously output (m+1)-th to (m+n)-th output signals in response to the first clock signal, the (m+1)-th to (m+n)-th output signals corresponding to (m+1)-th to (m+n)-th bits (n being an integer of 2 or more) of the code. The asynchronous counter further includes first to m-th delay circuits configured to respectively delay the first to m-th output signals such that the first to m-th bits of the code are output together at the same time when the (m+1)-th to (m+n)-th bits are output.

According to an exemplary embodiment, a code generator includes an asynchronous counter that receives a first clock signal and respectively outputs first output signals corresponding to first bits of a binary code based on the first clock signal, a synchronous counter that respectively outputs second output signals corresponding to second bits of the binary code based on a second clock signal obtained by dividing the first clock signal by the asynchronous counter, and a code converter that receives the first and second bits of the binary code and converts the binary code into a gray code.

According to an exemplary embodiment, an operating method of a code generator includes receiving a first clock signal, outputting a first output signal based on the first clock signal by using a first flip-flop, outputting second to m-th output signals by dividing a frequency of the first clock signal by using second to m-th flip-flops (m being an integer of 2 or more), delaying the first to m-th output signals corresponding to first to m-th bits of a code by first to m-th delay circuit, respectively, and synchronously outputting (m+1)-th to (m+n)-th output signals (n being an integer of 2 or more) corresponding to (m+1)-th to (m+n)-th bits of the code by using (m+1)-th to (m+n)-th flip-flops, at an edge of a second clock signal generated by dividing the first clock signal by using the first to m-th flip-flops.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
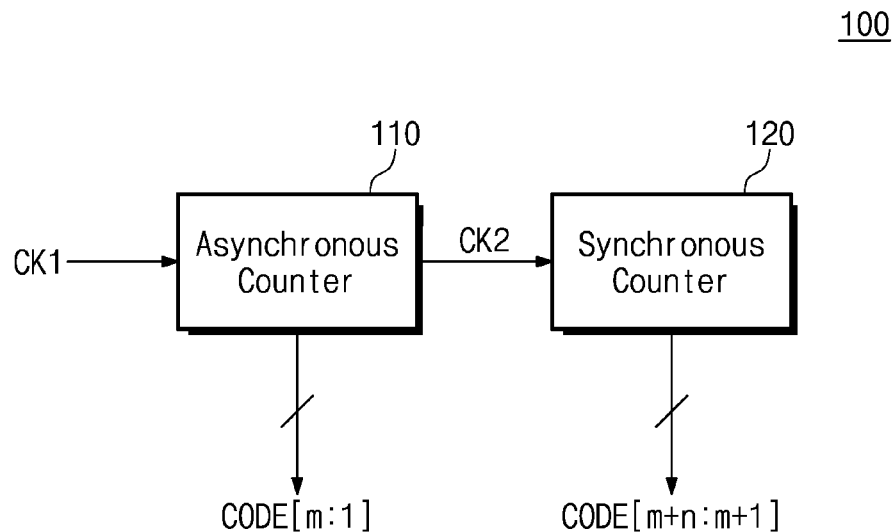
FIG. 1 illustrates a block diagram of a code generator according to example embodiments of the inventive concept.

FIG. 1 illustrates a block diagram of a code generator according to an example embodiment of the inventive concept. For example, a code generator 100 may be included in an electronic device, a semiconductor device, an integrated circuit, etc. The code generator 100 may use a counter. For example, the counter is implemented in an analog-to-digital converter (ADC) which is used to convert an analog signal into a digital signal. Referring to FIG. 1, the code generator 100 may include an asynchronous counter 110 and a synchronous counter 120.

The asynchronous counter 110 may receive a clock signal CK1 and may output or generate bits CODE[m:1] of a code (hereinafter referred to as "code bits") based on the clock signal CK1. For example, "m" may be an integer of 2 or more, and the asynchronous counter 110 may output multiple bits. For example, the clock signal CK1 may be transmitted from the outside of the code generator 100. For another example, the code generator 100 may further include a clock generator (e.g., a phase-locked loop (PLL) circuit or a delay-locked loop (DLL) circuit) that generates the clock signal CK1.

The asynchronous counter 110 may asynchronously output the code bits CODE[m:1] in response to the clock signal CK1. Here, the term "asynchronous" may mean that output times of the code bits CODE[m:1] are different from each other. The output times of the code bits CODE[m:1] determined by the asynchronous counter 110 may not be aligned with respect to the clock signal CK1. For example, the asynchronous counter 110 may output the code bit CODE[1] and may then output the code bit CODE[2]. The asynchronous counter 110 may sequentially output the code bits CODE[m:1] in the above manner.

The synchronous counter 120 may receive a clock signal CK2 and may output or generate code bits CODE[m+n:m+1] based on the clock signal CK2. For example, "n" may be an integer of 2 or more and may be equal to or different from "m". The synchronous counter 120 may output multiple bits. The synchronous counter 120 may synchronously output the code bits CODE[m+n:m+1] in response to the clock signal CK2. Here, the term "synchronous" may mean that output times of the code bits CODE[m+n:m+1] are the same as each other. The output times of the code bits CODE[m+n:m+1] determined by the synchronous counter 120 may be aligned with respect to the clock signal CK2. For example, the synchronous counter 120 may output the code bits CODE[m+n:m+1] at the same time.

The code bits CODE[m:1] that are output by the asynchronous counter 110 may correspond to lower bits. The code bits CODE[m+n:m+1] that are output by the synchronous counter 120 may correspond to upper bits. The code bit CODE[1] may correspond to a least significant bit (LSB). The code bit CODE[m+n] may correspond to a most significant bit (MSB).

Unlike the example illustrated in FIG. 1, it is assumed that the code generator 100 includes only the asynchronous counter 110. That is, the asynchronous counter 110 may output all the bits CODE[m+n:1] of a code. Compared to the case where the code generator 100 includes the synchronous counter 120, a difference (or a variation) between an output time of the code bit CODE[1] and an output time of the code bit CODE[m+n] may increase. The above difference may become greater as a level of a supply voltage of the code generator 100 decreases.

Unlike the example illustrated in FIG. 1, it is assumed that the code generator 100 includes only the synchronous counter 120. That is, the synchronous counter 120 may output all the bits CODE[m+n:1] of the code. When the code generator 100 includes the asynchronous counter 110, the synchronous counter 120 receives the clock signal CK2. However, when the code generator 100 does not include the asynchronous counter 110, the synchronous counter 120 may directly receive the clock signal CK1 that is a relatively high-speed clock signal compared with the clock signal CK2. The synchronous counter 120 may output the code bits CODE[m+n:1] by using a combinational logic circuit (refer to FIG. 3). Due to a propagation delay of the combinational logic circuit, as the number of code bits CODE[m+n:1] increases (or the size of a code becomes larger), a frequency of the clock signal CK1 to be provided to the synchronous counter 120 may be further restricted. Also, because the propagation delay of the combinational logic circuit increases as a level of the supply voltage of the code generator 100 decreases, the frequency of the clock signal CK1 to be provided to the synchronous counter 120 may be further restricted.

Referring to the FIG. 1, the code generator 100 according to an example embodiment of the inventive concept may solve the above restrictions and may include a hybrid counter that is able to operate even under a high speed and a low power condition. The hybrid counter may include both the asynchronous counter 110 and the synchronous counter 120. The asynchronous counter 110 may divide a frequency of the clock signal CK1. The clock signal CK1 that the asynchronous counter 110 receives may be different from the clock signal CK2 that the synchronous counter 120 receives. For example, when the frequency of the clock signal CK1 is "f", the frequency of the clock signal CK2 that is generated as a result of the division of the asynchronous counter 110 may be "f/$2^m$". Compared to the case of directly receiving the clock signal CK1, because the synchronous counter 120 receives the clock signal CK2 obtained by dividing the clock signal CK1, there may be solved a restriction on the frequency of the clock signal CK2 due to the combinational logic circuit of the synchronous counter 120.

Figure 2A:
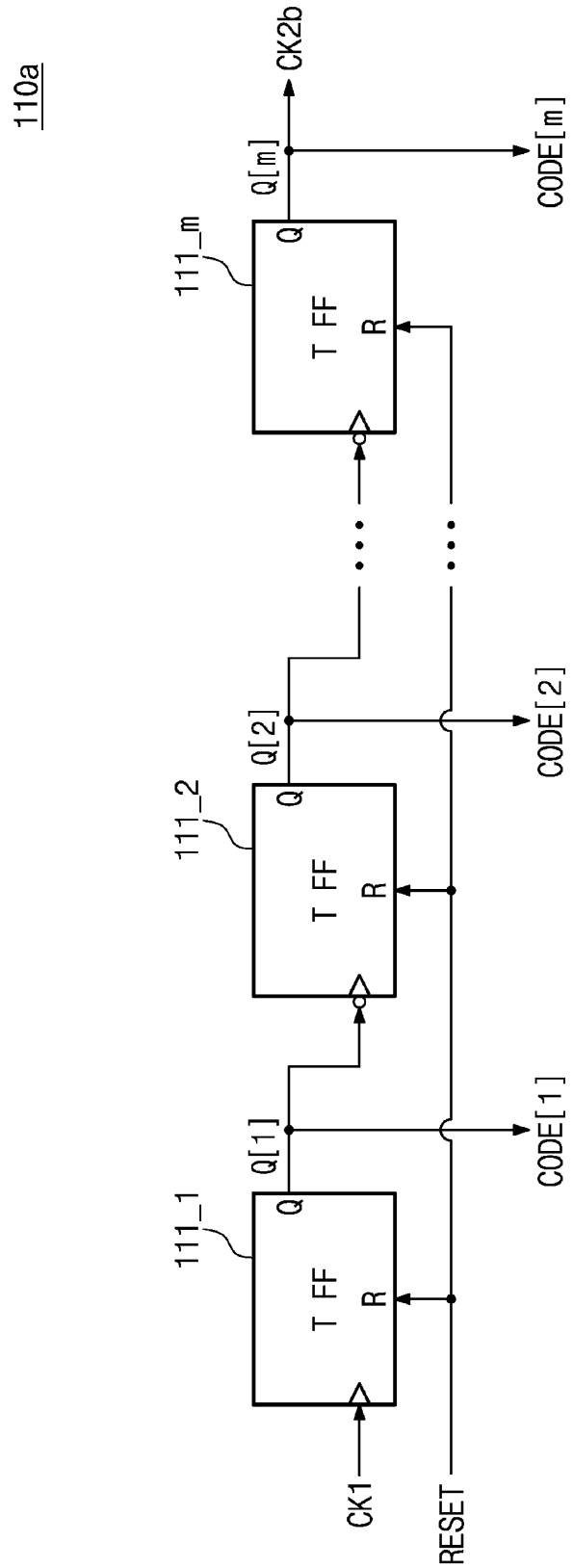
FIGS. 2A to 2C illustrate block diagrams of an asynchronous counter of FIG. 1 according to example embodiments.
Figure 2B:
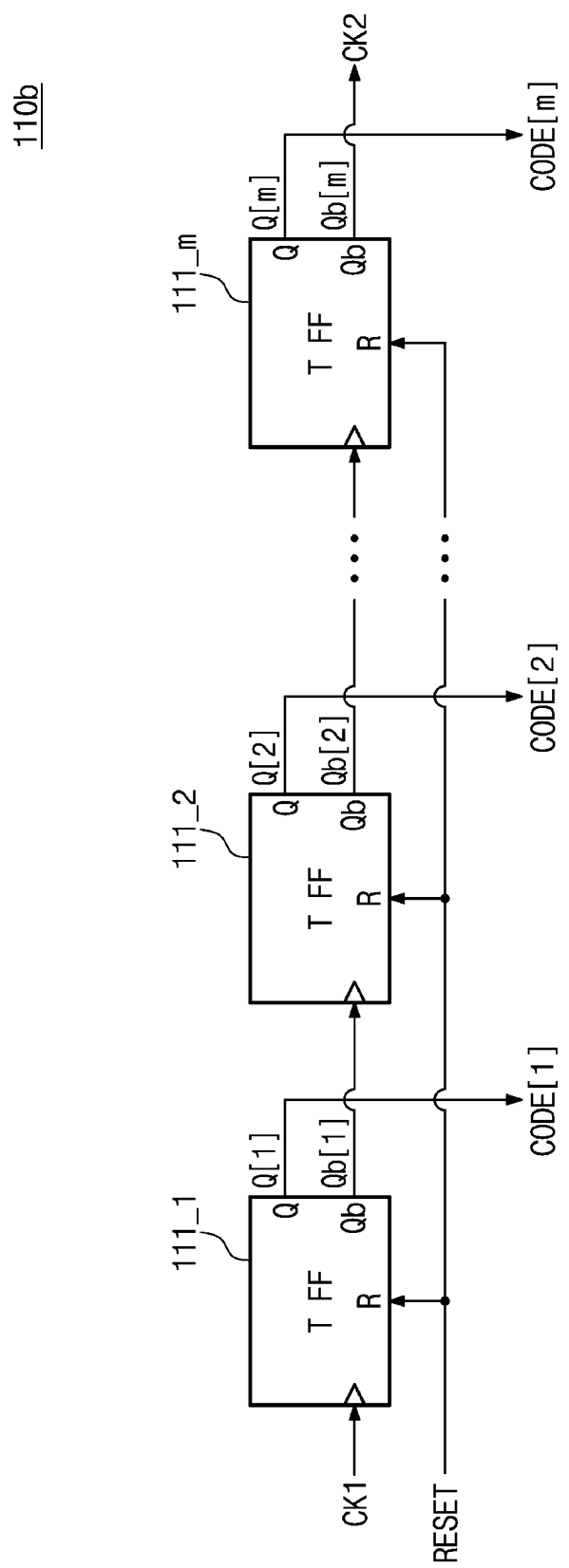
Figure 2C:
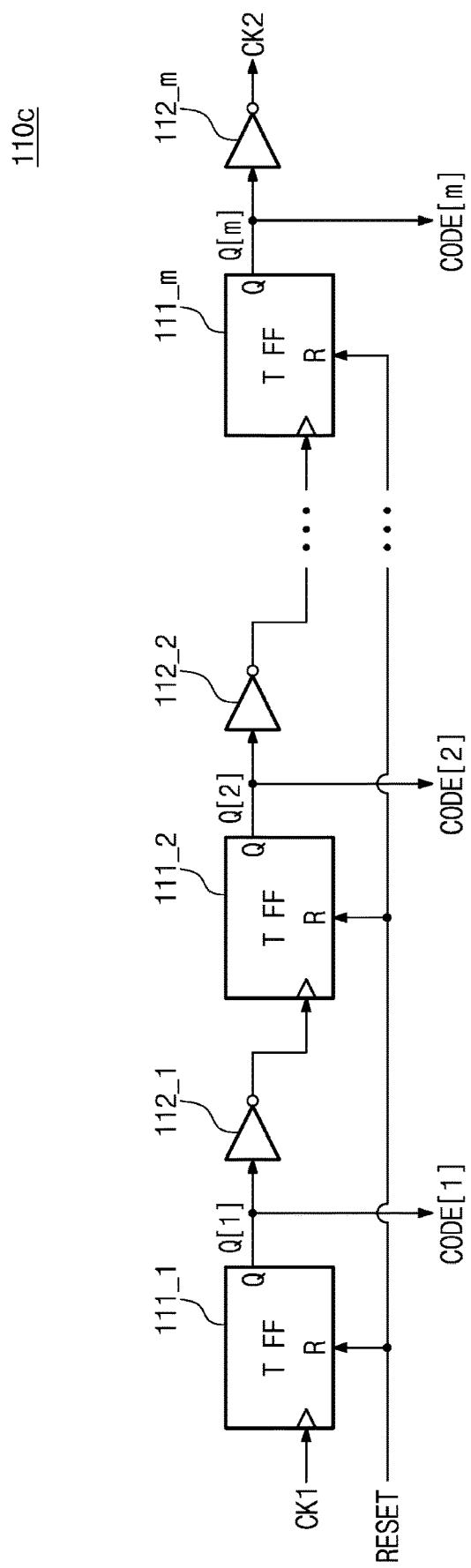

FIGS. 2A to 2C illustrate block diagrams of an asynchronous counter of FIG. 1 according to example embodiments. Each of asynchronous counters 110a, 110b, and 110c may be an example of the asynchronous counter 110 of FIG. 1. The asynchronous counters 110a, 110b, and 110c will be described together. The asynchronous counter 110a may include flip-flops 111_1 to 111_m. The asynchronous counter 110b may include flip-flops 111_1 to 111_m. The asynchronous counter 110c may include flip-flops 111_1 to 111_m and inverters 112_1 to 112_m.

Each of the flip-flops 111_1 to 111_m may include a clock port, a reset port "R", and an output port "Q". Each of the flip-flops 111_1 to 111_m may include an input port and an inverted output port (not illustrated) (refer to FIG. 7). The inverted output port of each of the flip-flops 111_1 to 111_m may be electrically connected to the input port thereof. For example, each of the flip-flops 111_1 to 111_m may be a trigger (toggle) flip-flop or a JK flip-flop, but a kind of flip-flop is not limited thereto. Each of the flip-flops 111_1 to 111_m may toggle, change, or invert a logical value of an output signal to be output through the output port "Q" at an edge of a clock signal received through the clock port. The edge may be a rising edge or a falling edge of the clock signal received through the clock port.

Each of the flip-flops 111_1 to 111_m may reset a logical value of the output signal to be output through the output port "Q" to a given value (e.g., logic "0" or logic "1") in response to a reset signal RESET received through the reset port "R". Each of the flip-flops 111_1 to 111_m may reset a logical value of the output signal when the reset signal RESET is activated. Each of the flip-flops 111_1 to 111_m may toggle a logical value of the output signal at an edge of the clock signal received through the clock port in a state where the reset signal RESET is deactivated. For example, the flip-flops 111_1 to 111_m may be implemented to be identical to each other.

The flip-flop 111_1 may receive the clock signal CK1 input to the code generator 100 through the clock port. For example, the flip-flop 111_1 may not receive an inverted clock signal of the clock signal CK1. The clock signal CK1 may be transmitted to the code generator 100 in a single mode, not in a differential mode. The flip-flop 111_1 may toggle a logical value of an output signal Q[1] to be output through the output port "Q" at an edge of the clock signal CK1. The output signal Q[1] of the flip-flop 111_1 may correspond to the code bit CODE[1]. The inverted output port of the flip-flop 111_1 may be electrically connected to the input port thereof. A frequency of the output signal Q[1] may be half the frequency of the clock signal CK1. The flip-flop 111_1 may divide the clock signal CK1 by 2 and may output the output signal Q[1].

The flip-flop 111_2 of FIG. 2A may directly receive the output signal Q[1] of the flip-flop 111_1 through the clock port. In FIG. 2A, the flip-flop 111_2 may be the same as the flip-flop 111_1. However, the flip-flop 111_1 may perform a toggling operation at a rising edge of the clock signal CK1, while the flip-flop 111_2 may perform a toggling operation at a falling edge of the output signal Q[1]. The remaining flip-flops 111_3 to 111_m of FIG. 2A may perform a toggling operation at a falling edge of the output signals Q[2] to Q[m]. In some examples, unlike the example illustrated in FIG. 2A, the flip-flop 111_1 may perform a toggling operation at a falling edge of the clock signal CK1, and the flip-flops 111_2 to 111_m may perform a toggling operation at a rising edge of the output signals Q[2] to Q[m].

The flip-flop 111_2 of FIG. 2B may directly receive an inverted output signal Qb[1] of the flip-flop 111_1 through the clock port. The flip-flops 111_1 to 111_m of FIG. 2B may be implemented to be identical to each other and may perform a toggling operation at a rising edge of the clock signal CK1 and the output signals Qb[1] to Qb[m]. In some examples, unlike the example illustrated in FIG. 2B, the flip-flops 111_1 to 111_m may perform a toggling operation at a falling edge of the clock signal CK1 and the output signals Qb[1] to Qb[m].

The asynchronous counter 110c of FIG. 2C may further include the inverters 112_1 to 112_m. The inverter 112_1 of FIG. 2C may invert a logical value of the output signal Q[1]. The flip-flop 111_2 may receive a signal (e.g., an output signal of the inverter 112_1), which corresponds to an inverted version of the output signal Q[1] from the flip-flop 111_1, through the clock port.

An operation of the flip-flop 111_2 may be the same as the operation of the flip-flop 111_1 except that the flip-flop 111_2 of FIGS. 2A to 2C receives the output signal Q[1] of the previous flip-flop 111_1, the inverted output signal Qb[1] of the previous flip-flop 111_1, or the output signal of the inverter 112_1 through the clock port.

The flip-flop 111_2 may toggle a logical value of an output signal Q[2] to be output through the output port "Q" at an edge of the output signal Q[1], the inverted output signal Qb[1], or the output signal of the inverter 112_1. The output signal Q[2] of the flip-flop 111_2 may correspond to the code bit CODE[2]. An inverted output port of the flip-flop 111_2 may be electrically connected to the input port thereof. A frequency of the output signal Q[2] may be half the frequency of the output signal Q[1] and may be ¼ of the frequency of the clock signal CK1. The flip-flop 111_2 may divide the output signal Q[1] by 2 and may output the output signal Q[2]. The inverter 112-2 may invert a logical value of the output signal Q[2].

Each of the asynchronous counters 110a, 110b, and 110c may include the "m" flip-flops 111_1 to 111_m and/or the "m" inverters 112_1 to 112_m respectively corresponding to the code bits CODE[m:1]. An operation of the flip-flop 111_m may be the same as the operation of the flip-flop 111_2 except that the flip-flop 111_m receives, through the clock port, an output signal Q[m−1] or an inverted output signal Qb[m−1] of a previous flip-flop 111_m−1 (not illustrated) or an output signal of an inverter in front of the flip-flop 111_m. An output signal Q[m] output through the output port "Q" of the flip-flop 111_m may correspond to the code bit CODE[m]. The inverter 112_m may invert a logical value of the output signal Q[m].

The output signal Q[m] of the flip-flop 111_m of FIG. 2A may be an inverted clock signal CK2b, and a frequency thereof may correspond to a result of dividing the frequency of the clock signal CK1 by $2^m$. The output signal Q[m] of the flip-flop 111_m of FIG. 2B may be the clock signal CK2, and a frequency thereof may correspond to a result of dividing the frequency of the clock signal CK1 by $2^m$. A frequency of the clock signal CK2 output through the inverter 112_m of FIG. 2C may correspond to a result of dividing the frequency of the clock signal CK1 by $2^m$.

The flip-flops 111_2 to 111_m may divide the output signals Q[m−1:1] provided from the previous flip-flops 111_1 to 111_m−1 by 2, respectively. For example, the clock signal CK2 or the inverted clock signal CK2b obtained by dividing the clock signal CK1 by "m" may be transmitted to the synchronous counter 120.

The output signal Q[1] of the flip-flop 111_1 may correspond to the code bit CODE[1] and may be provided to the flip-flop 111_2 as a clock signal. The flip-flop 111_1 may determine an output time of the output signal Q[1] (i.e., a time when a logical value of the output signal Q[1] is determined) with respect to an edge of the clock signal CK1. The flip-flop 111_2 may determine an output time of the output signal Q[2] with respect to an edge of the output signal Q[1] or the inverted output signal Qb[1], not the clock signal CK1. The flip-flop 111_m may determine an output time of the output signal Q[m] with respect to an edge of the output signal Q[m−1], the inverted output signal Qb[m−1], or an output signal of an inverter in front of the flip-flop 111_m. The output time of the flip-flop 111_m may be next to the output time of the flip-flop 111_m−1. The asynchronous counters 110a, 110b, and 110c may output the code bits CODE[m:1] asynchronously or sequentially.

Figure 3:
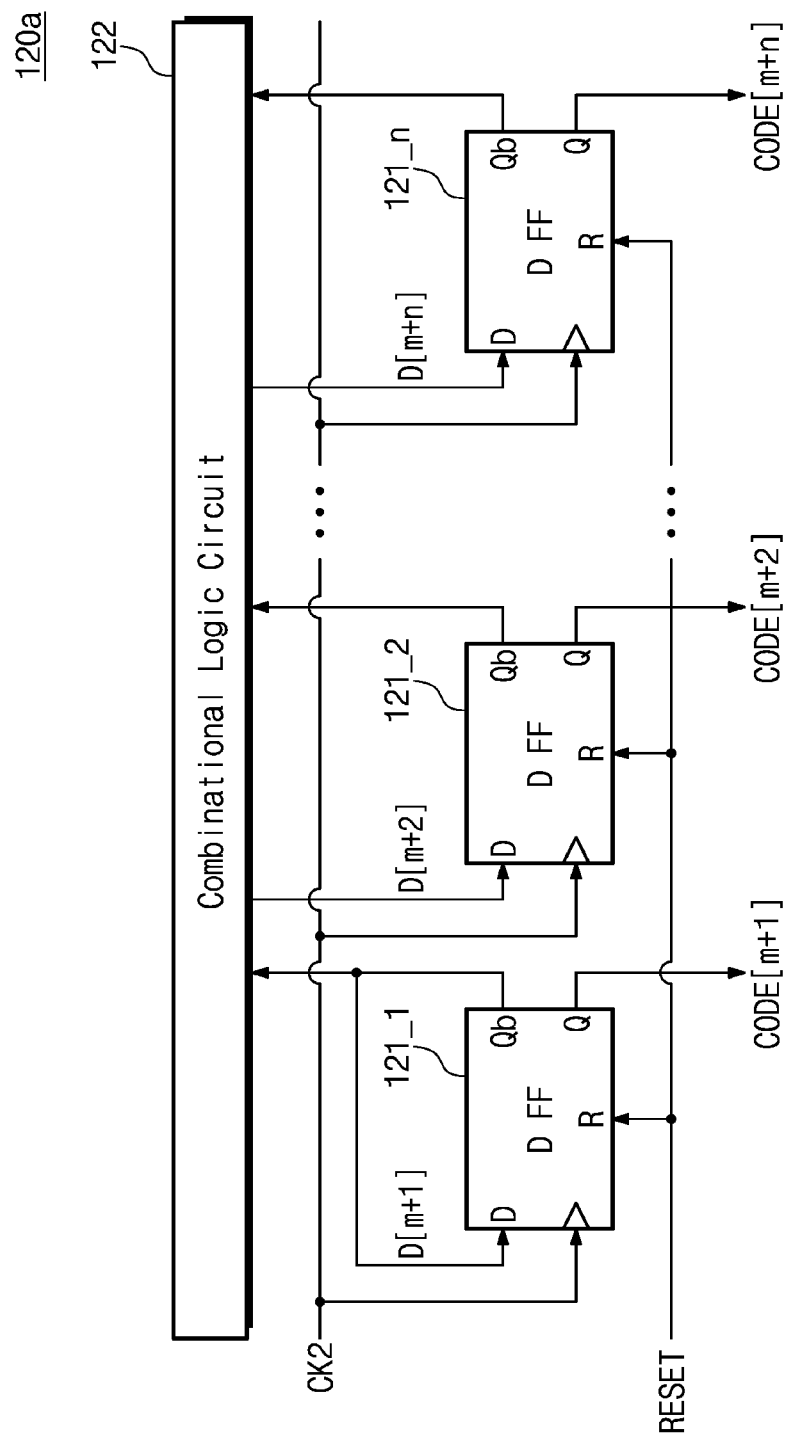
FIG. 3 illustrates a block diagram of a synchronous counter of FIG. 1 according to example embodiments.

FIG. 3 illustrates a block diagram of a synchronous counter of FIG. 1 according to example embodiments. A synchronous counter 120a may be an example of the synchronous counter 120 of FIG. 1. The synchronous counter 120a may include flip-flops 121_1 to 121_n and a combinational logic circuit 122.

Each of the flip-flops 121_1 to 121_n may include a clock port, an input port "D", an output port "Q", an inverted output port Qb, and a reset port "R". For example, each of the flip-flops 121_1 to 121_n may be a D flip-flop.

Each of the flip-flops 121_1 to 121_n may latch a logical value of an input signal received through the input port "D" at an edge of a clock signal received through the clock port and may output an output signal having the latched logical value through the output port "Q". Unlike the flip-flops 111_1 to 111_m of the asynchronous counters 110a, 110b, and 110c, the flip-flops 121_1 to 121_n of the synchronous counter 120a may receive the clock signal CK2 in common. Unlike the example illustrated in FIG. 3, the flip-flops 121_1 to 121_n of the synchronous counter 120a may receive the inverted clock signal CK2b in common.

For example, the inverter 112_m may be a driver that drives the clock signal CK2 such that the clock signal CK2 is appropriately transmitted to all the flip-flops 121_1 to 121_n of the synchronous counter 120a. For another example, the asynchronous counter 110 may include a driver that drives the clock signal CK2. The driver may include the inverter 112_m or may buffer and output the clock signal CK2 provided from the inverter 112_m. The flip-flops 121_1 to 121_n may respectively latch logical values of input signals D[m+n:m+1] at an edge of the clock signal CK2 and may output respective output signals Q[m+n:m+1] (not shown). For example, the flip-flops 121_1 to 121_n may be implemented to be identical to each other. In some examples, when the flip-flops 121_1 to 121_n of the synchronous counter 120a use the inverted clock signal CK2b, the flip-flops 121_1 to 121_n may receive a clock signal inverted with respect to the inverted clock signal CK2b by using an inverter.

The output signals Q[m+n:m+1] may correspond to the code bits CODE[m+n:m+1], respectively. An edge of the clock signal CK2 may correspond to an edge of the output signal Q[m] of the flip-flop 111_m of the asynchronous counter 110a, 110b, or 110c. The flip-flops 121_1 to 121_n of the synchronous counter 120a may receive the clock signal CK2 in common. The synchronous counter 120a may output the code bits CODE[m+n:m+1] synchronously or simultaneously with each other.

Each of the flip-flops 121_1 to 121_n may reset a logical value of an output signal to be output through the output port "Q" to a given value (e.g., logic "0" or logic "1") in response to the reset signal RESET received through the reset port "R". Each of the flip-flops 121_1 to 121_n may reset a logical value of the output signal when the reset signal RESET is activated. Each of the flip-flops 121_1 to 121_n may latch a logical value of an input signal at an edge of the clock signal CK2 received through the clock port in a state where the reset signal RESET is deactivated. The reset signal RESET transmitted to the flip-flops 121_1 to 121_n of the synchronous counter 120a may be the same as or different from the reset signal RESET transmitted to the flip-flops 111_1 to 111_m of each of the asynchronous counters 110a, 110b, and 110c.

The combinational logic circuit 122 may perform various logical operations, such as inverter (INV), NAND, AND, NOR, OR, exclusive NOR (XNOR), and XOR operations, with respect to inverted output signals Qb[m+n:m+1] or the output signals Q[m+n:m+1] of the flip-flops 121_1 to 121_n. The combinational logic circuit 122 may include at least one logic gate (e.g., an inverter, a NAND gate, an AND gate, a NOR gate, an OR gate, an XNOR gate, or an XOR gate) for performing the logical operations. The combinational logic circuit 122 may output input signals D[m+2:m+n] of the flip-flops 121_2 to 121_n by using the inverted output signals Qb[m+n:m+1].

Referring to FIG. 3, an inverted output port Qb of the flip-flop 121_1 of the synchronous counter 120a outputting the code bit CODE[m+1] may be electrically connected to the input port "D" thereof. For example, as in the flip-flops 111_1 to 111_m of the asynchronous counters 110a, 110b, and 110c, the flip-flop 121_1 may be a T flip-flop. The flip-flop 121_1 may be implemented to be the same as the flip-flops 111_1 to 111_m of the asynchronous counters 110a, 110b, and 110c. In contrast, each of the remaining flip-flops 121_2 to 121_n of the synchronous counter 120a may be a D flip-flop. The flip-flops 121_2 to 121_n may be implemented to identical to each other. Unlike the example illustrated in FIG. 3, all the flip-flops 121_1 to 121_n of the synchronous counter 120a may be implemented with the D flip-flops according to a logical operation that the combinational logic circuit 122 performs.

Figure 4:
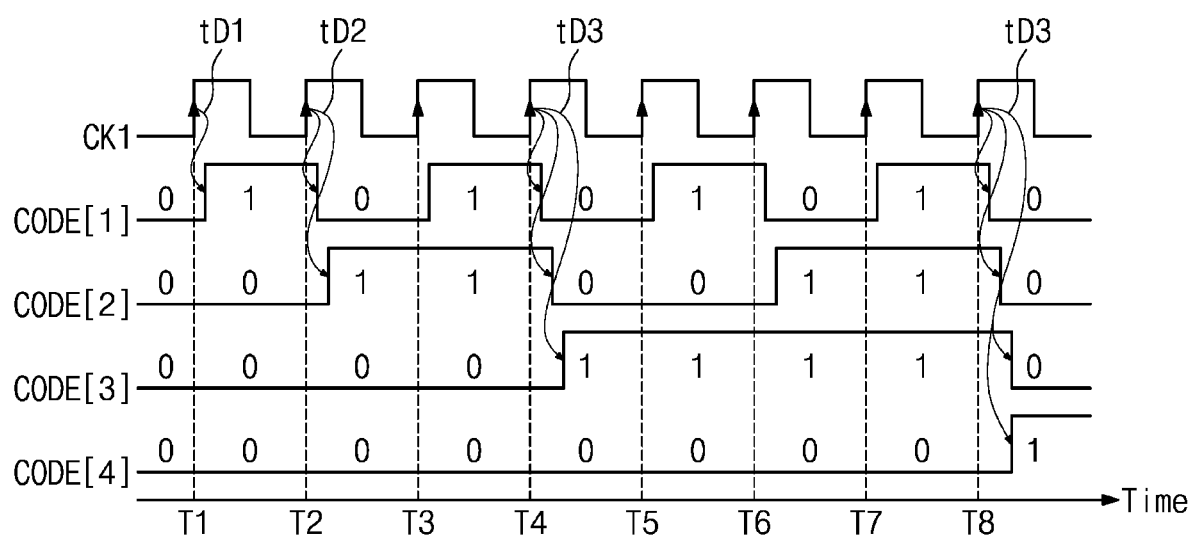
FIG. 4 is a timing diagram illustrating an operation of a code generator of FIG. 1 according to example embodiments.

FIG. 4 is a timing diagram illustrating an operation of a code generator of FIG. 1 according to example embodiments. FIG. 4 will be described with reference to FIGS. 1, 2C and 3. In FIG. 4, it is assumed that the asynchronous counter 110 of FIG. 1 is the asynchronous counter 110c of FIG. 2C, the synchronous counter 120 of FIG. 1 is the synchronous counter 120a of FIG. 3, and each of "m" and "n" is 2. Timing diagrams of the asynchronous counters 110a and 110b may be similar to the timing diagram of the asynchronous counter 110c. The asynchronous counter 110c may output code bits CODE[2:1], the synchronous counter 120a may output code bits CODE[4:3]. When each of "m" and "n" is 2, for example, the code generator 100 may count 0 to 15 ($=2^{4(=m+n)}-1$) with respect to a rising edge of the clock signal CK1. For another example, the code generator 100 may perform a counting operation with respect to a falling edge of the clock signal CK1. For another example, the code generator 100 may perform a counting operation with respect to both the rising edge and the falling edge of the clock signal CK1. The reset signal RESET may be activated before a time point T1 and may be then deactivated. Logical values of all the code bits CODE[4:1] may be reset to 0 in response to the reset signal RESET. Values assumed in FIG. 4 are only exemplary.

After the reset signal RESET is activated and is then deactivated, at the time point T1, a logical value of the clock signal CK1 may toggle (change) from 0 to 1. The clock signal CK1 may have the rising edge at the time point T1. The flip-flop 111_1 of the asynchronous counter 110c may toggle a logical value of the code bit CODE[1] from 0 to 1 at the rising edge of the clock signal CK1 (i.e., in response to the rising edge of the clock signal CK1). Values of the code bits CODE[4:1] may be updated from $0000_{(2)}$ to $0001_{(2)}$ with respect to the time point T1. Referring to FIG. 4, the code bit CODE[1] or the output signal Q[1] may be output by the flip-flop 111_1 after the time point T1 when the clock signal CK1 has a low-to-high transition (a rising edge of the clock signal CK1 may be placed at the time point T1). A time difference (delay) between the time point T1 and an output time of the code bit CODE[1] may be tD1. The time difference tD1 may correspond to a CK-Q delay of the flip-flop 111_1. A delay may be referred to as a "delay time".

The clock signal CK1 may have the rising edge at a time point T2. In another embodiment, the flip-flop 111_1 of the asynchronous counter 110c may toggle a logical value of the code bit CODE[1] from 1 to 0 at the rising edge of the clock signal CK1. The flip-flop 111_2 of the asynchronous counter 110c may toggle a logical value of the code bit CODE[2] from 0 to 1 at a falling edge of the output signal Q[1] (i.e., CODE[1]) of the flip-flop 111_1. Values of the code bits CODE[4:1] may be updated from $0001_{(2)}$ to $0010_{(2)}$ with respect to the time point T2. Referring to FIG. 4, the code bit CODE[2] (or Q[2]) may be output by the flip-flop 111_2 after the output time of the code bit CODE[1].

A time difference between the time point T2 and the output time of the code bit CODE[1] may be tD1. A time difference between the output time of the code bit CODE[1] and the output time of the code bit CODE[2] may be a sum of a propagation delay of the inverter 112_1 and a CK-Q delay of the flip-flop 111_2. A time difference between the time point T2 and the output time of the code bit CODE[2] may be tD2. The time difference tD2 may correspond to the CK-Q delay of the flip-flop 111_1, the propagation delay of the inverter 112_1, and the CK-Q delay of the flip-flop 111_2. The asynchronous counter 110c may output the code bits CODE[2:1] asynchronously. In the case where the inverter 112_1 is not included in the asynchronous counter 110c, the propagation delay of the inverter 112_1 may not be applied to the above time difference.

An operation of the asynchronous counter 110c at each of time points T3 to T8 are substantially the same as the operation of the asynchronous counter 110c at the time point T1 or T2. Values of the code bits CODE[4:1] may be updated from $0010_{(2)}$ to $0011_{(2)}$ with respect to the time point T3.

At a time point T4, the flip-flops 121_1 and 121_2 of the synchronous counter 120a may respectively latch logical values of the code bits CODE[3] and CODE[4] at a falling edge of the output signal Q[2] (i.e., CODE[2]) of the flip-flop 111_2. The flip-flop 121_1 may determine a logical value of the code bit CODE[3] as "1" at the falling edge of the output signal Q[2] of the flip-flop 111_2. The flip-flop 121_2 may determine a logical value of the code bit CODE[4] as "0" at the falling edge of the output signal Q[2] of the flip-flop 111_2. In this case, the combinational logic circuit 122 may output "0" as D[m+2] with respect to the time point T4. Values of the code bits CODE[4:1] may be updated from $0011_{(2)}$ to $0100_{(2)}$ with respect to the time point T4.

A time difference between the time point T4 and the output time of the code bit CODE[1] may be tD1. A time difference between the time point T4 and the output time of the code bit CODE[2] may be tD2. A time difference between the output time of the code bit CODE[2] and the output time of the code bit CODE[3] may be a sum of a propagation delay of the inverter 112_2 and a CK-Q delay of the flip-flop 121_1. A time difference between the time point T4 and the output time of the code bit CODE[3] may be tD3. The time difference tD3 may correspond to the CK-Q delay of the flip-flop 111_1, the propagation delay of the inverter 112_1, the CK-Q delay of the flip-flop 111_2, the propagation delay of the inverter 112_2, and the CK-Q delay of the flip-flop 121_1. In the case where the inverters 112_1 and 112_2 are not included in the asynchronous counter 110c, the propagation delays of the inverters 112_1 and 112_2 may not be applied to the above time difference.

An operation of the synchronous counter 120a at a time point T8 is substantially the same as the operation of the asynchronous counter 110c at the time point T4. Values of the code bits CODE[4:1] may be updated from $0100_{(2)}$ to $0101_{(2)}$ with respect to the time point T5. Values of the code bits CODE[4:1] may be updated from $0101_{(2)}$ to $0110_{(2)}$ with respect to the time point T6. Values of the code bits CODE[4:1] may be updated from $0110_{(2)}$ to $0111_{(2)}$ with respect to the time point T7. Values of the code bits CODE[4:1] may be updated from $0111_{(2)}$ to $1000_{(2)}$ with respect to the time point T8.

A time difference between the time point T4 and the output time of the code bit CODE[1] may be tD1. A time difference between the time point T4 and the output time of the code bit CODE[2] may be tD2. A time difference between the time point T4 and the output time of the code bit CODE[3] may be tD3. A time difference between the time point T4 and the output time of the code bit CODE[4] may be tD3. The asynchronous counter 110c may output the code bits CODE[2:1] asynchronously. The synchronous counter 120a may output the code bits CODE[4:3] synchronously.

Figure 5:
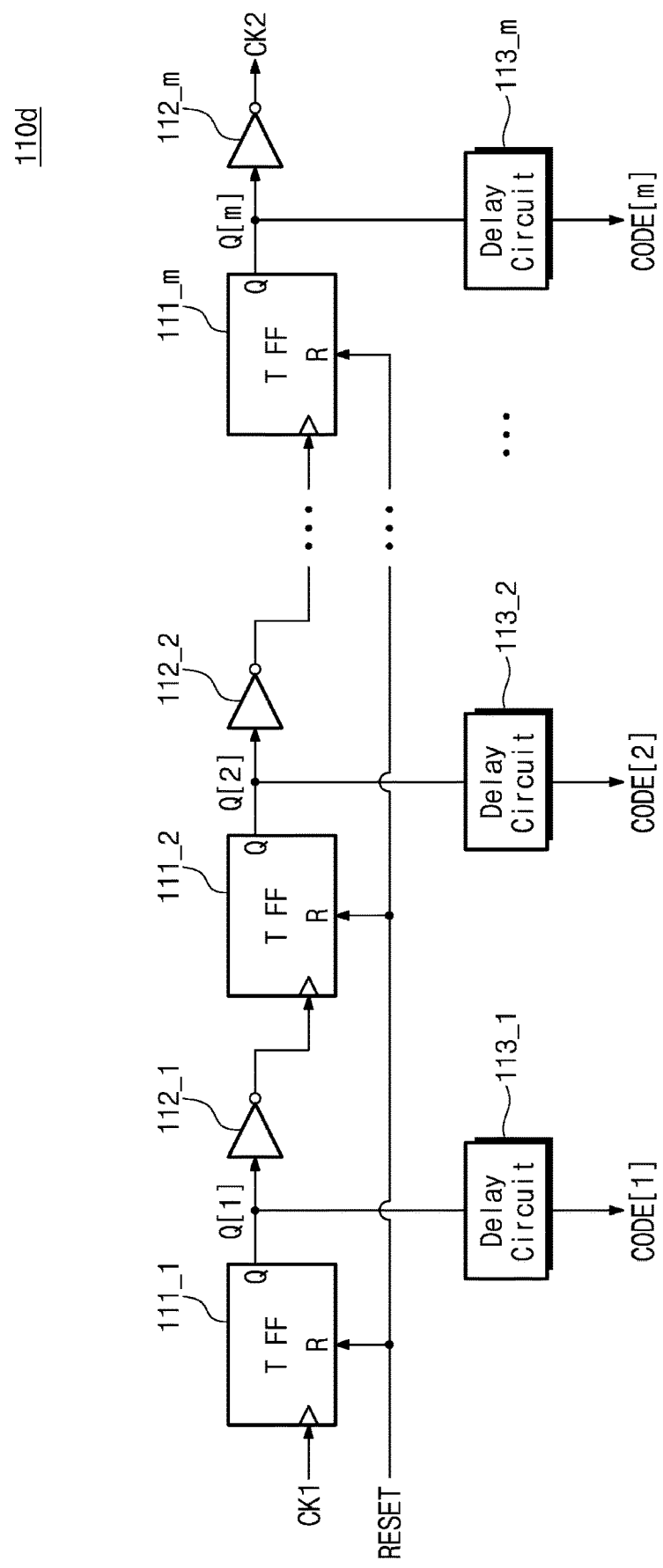
FIG. 5 illustrates a block diagram of an asynchronous counter of FIG. 1 according to example embodiments.

FIG. 5 illustrates a block diagram of an asynchronous counter of FIG. 1 according to example embodiments. An asynchronous counter 110d may be another example of the asynchronous counter 110 of FIG. 1. A difference between the asynchronous counter 110d and the asynchronous counter 110c will be mainly described. The asynchronous counter 110d may include the flip-flops 111_1 to 111_m and the inverters 112_1 to 112_m. Compared with the asynchronous counter 110c, the asynchronous counter 110d may further include delay circuits 113_1 to 113_m.

The delay circuits 113_1 to 113_m may respectively delay the output signals Q[m:1] of the flip-flops 111_1 to 111_m and may output the code bits CODE[m:1] simultaneously or synchronously. The code bits CODE[m:1] may correspond to signals that are obtained by delaying the output signals Q[m:1]. For example, the delay circuits 113_1 to 113_m may delay the output signals Q[m:1] such that the code bits CODE[m:1] are output synchronously (or simultaneously). Delays by which the output signals Q[m:1] of the flip-flops 111_1 to 111_m are delayed by the delay circuits 113_1 to 113_m may be different from each other.

The delay circuits 113_1 to 113_m may delay the output signals Q[m:1] such that the code bits CODE[m:1] are output together at a time point when the code bits [m+1:m+n] are output. For example, the delay circuit 113_1 may delay the output signal Q[1] as much as a sum of the CK-Q delays of the flip-flops 111_2 to 111_m, the propagation delays of the inverters 112_1 to 112_m, and the CK-Q delay of the flip-flop 121_1. The delay circuit 113_1 may be a replica circuit that is implemented by replicating the flip-flops 111_2 to 111_m, the inverters 112_1 to 112_m, and the flip-flop 121_1. In the case where the inverters 112_1 to 112_m are not included in the flip-flops 111_1 to 111_m, the delay circuit 113_1 may delay the output signal Q[1] as much as a sum of the CK-Q delays of the flip-flops 111_2 to 111_m and the CK-Q delay of the flip-flop 121_1.

The delay circuit 113_2 may delay the output signal Q[2] as much as a sum of the CK-Q delays of the flip-flops 111_3 to 111_m, the propagation delays of the inverters 112_2 to 112_m, and the CK-Q delay of the flip-flop 121_1. The delay circuit 113_2 may be a replica circuit that is implemented by replicating the flip-flops 111_3 to 111_m, the inverters 112_2 to 112_m, and the flip-flop 121_1. The delay circuit 113_m may delay the output signal Q[m] as much as a sum of the propagation delay of the inverter 112_m and the CK-Q delay of the flip-flop 121_1. For example, a difference between the delay of the delay circuit 113_m and the delay of the delay circuit 113_m−1 may correspond to a sum of the propagation delay of the inverter 112_m−1 and the CK-Q delay of the flip-flop 111_m. The delay of the delay circuit 113_1 may be the greatest, and the delay of the delay circuit 113_m may be the smallest. As "m" increases, the delay of the delay circuit 113_m may gradually decrease.

Figure 6:
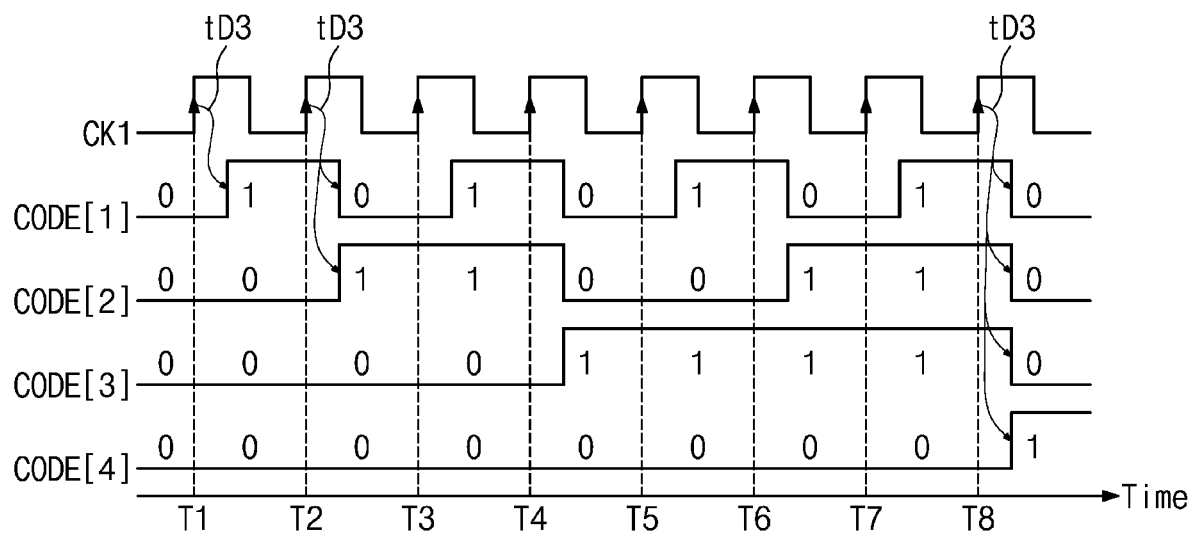
FIG. 6 is a timing diagram illustrating an operation of a code generator of FIG. 1 according to example embodiments.

FIG. 6 is a timing diagram illustrating an operation of a code generator of FIG. 1 according to example embodiments. FIG. 6 will be described with reference to FIGS. 1, 3 and 5. In FIG. 6, it is assumed that the asynchronous counter 110 of FIG. 1 is the asynchronous counter 110d of FIG. 5, the synchronous counter 120 of FIG. 1 is the synchronous counter 120a of FIG. 3, and each of "m" and "n" is 2. Below, a difference between the timing diagram FIG. 6 and the timing diagram of FIG. 4 will be described below.

The flip-flop 111_1 of the asynchronous counter 110d may toggle a logical value of the code bit CODE[1] from 0 to 1 at the rising edge (the time point T1) of the clock signal CK1. A time difference between the time point T1 and the output time of the code bit CODE[1] may correspond to not tD1 but tD3 by the delay circuit 113_1. The time difference tD3 may correspond to a sum of the CK-Q delay of the flip-flop 111_1, the propagation delay of the inverter 112_1, the CK-Q delay of the flip-flop 111_2, the propagation delay of the inverter 112_2, and the CK-Q delay of the flip-flop 121_1. The delay of the delay circuit 113_1 may correspond to a sum of the propagation delay of the inverter 112_1, the CK-Q delay of the flip-flop 111_2, the propagation delay of the inverter 112_2, and the CK-Q delay of the flip-flop 121_1.

The flip-flop 111_1 of the asynchronous counter 110d may toggle a logical value of the code bit CODE[1] from 1 to 0 at the rising edge (the time point T8) of the clock signal CK1. The flip-flop 111_2 of the asynchronous counter 110d may toggle a logical value of the code bit CODE[2] from 1 to 0 at the rising edge (the time point T8) of the clock signal CK1. A time difference between the time point T8 and the output time of the code bit CODE[1] may be tD3. A time difference between the time point T8 and the output time of the code bit CODE[2] may be tD3. According to example embodiments, the asynchronous counter 110d may toggle a logical value of the code bit CODE[1] and a logical value of the code bit CODE[2], simultaneously.

The flip-flop 111_2 of the asynchronous counter 110d may toggle a logical value of the code bit CODE[2] from 0 to 1 at the rising edge (the time point T2) of the clock signal CK1. A time difference between the time point T2 and the output time of the code bit CODE[2] may correspond to not tD2 but tD3 by the delay circuit 113_2. The delay of the delay circuit 113_2 may correspond to a sum of the propagation delay of the inverter 112_2 and the CK-Q delay of the flip-flop 121_1. Unlike the asynchronous counter 110c, the asynchronous counter 110d may synchronously output the code bits CODE[2:1] by using the delay circuits 113_1 and 113_2.

The flip-flop 121_1 of the synchronous counter 120a may toggle a logical value of the code bit CODE[3] from 1 to 0 at the rising edge (the time point T8) of the clock signal CK1. The flip-flop 121_2 of the synchronous counter 120a may toggle a logical value of the code bit CODE[4] from 0 to 1 at the rising edge (the time point T8) of the clock signal CK1. A time difference between the time point T8 and the output time of the code bit CODE[3] may be tD3. A time difference between the time point T8 and the output time of the code bit CODE[4] may be tD3. According to example embodiments, the synchronous counter 120a may toggle a logical value of the code bit CODE[3] and a logical value of the code bit CODE[4], simultaneously.

According to example embodiments, the code generator 100 including the asynchronous counter 110d and the synchronous counter 120a may simultaneously toggle a logical value of each of the code bits CODE[1] to CODE[4] at the rising edge of the clock signal CK1.

Figure 7:
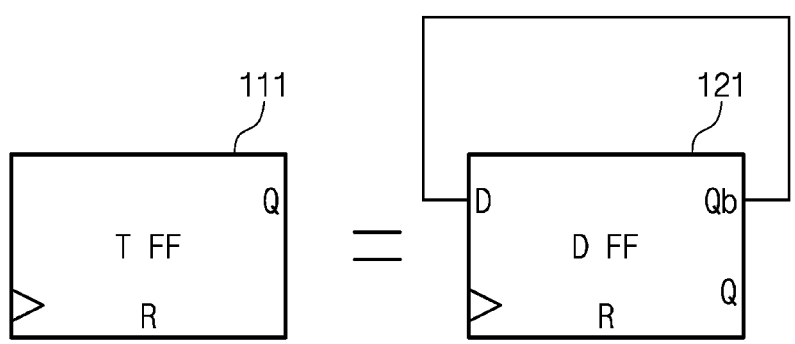
FIG. 7 illustrates a flip-flop illustrated in FIGS. 2A to 2C, 3, and 5 according to example embodiments.

FIG. 7 illustrates a flip-flop illustrated in FIGS. 2A to 2C, 3, and 5 according to example embodiments. A flip-flop 111 of FIG. 7 may be one of the flip-flops 111_1 to 111_m of the asynchronous counter 110a to 110c and may be a T flip-flop.

A flip-flop 121 of FIG. 7 may be one of the flip-flops 121_1 to 121_n of the synchronous counter 120a and may be a D flip-flop. Referring to FIG. 7, when the inverted output port Qb of the flip-flop 121 is fed back to the input port "D" or may be electrically connected to the input port "D", the flip-flop 121 may operate the same as the flip-flop 111. For example, the flip-flops 111_1 to 111_m of the asynchronous counters 110a to 110c may be respectively implemented by using the flip-flop 121 where the output port Qb is electrically connected to the input port "D".

Figure 8:
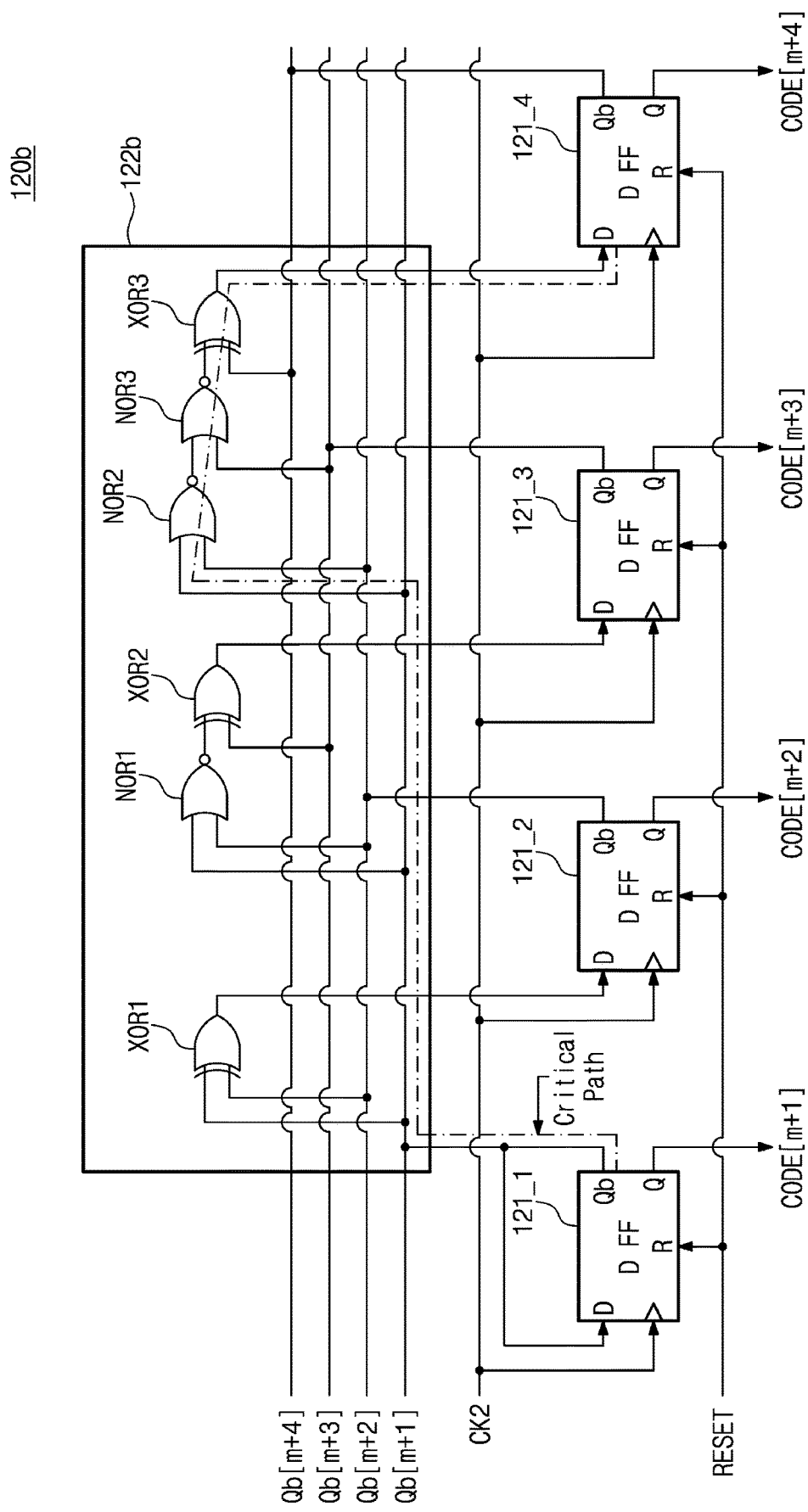
FIG. 8 illustrates a block diagram of a synchronous counter of FIG. 1 according to example embodiments.

FIG. 8 illustrates a block diagram of a synchronous counter of FIG. 1 according to example embodiments. The synchronous counter 120b may be an example of the synchronous counter 120 of FIG. 1. In FIG. 8, it is assumed that "n" is 4. The synchronous counter 120b may include flip-flops 121_1 to 121_4 and a combinational logic circuit 122b. The flip-flops 121_1 to 121_n of the synchronous counter 120a may be the same as the flip-flops 121_1 to 121_4 of the synchronous counter 120b. The combinational logic circuit 122b may be an example of the combinational logic circuit 122 of FIG. 3.

The combinational logic circuit 122b may include at least one or more logic gates that perform logical operations on inverted output signals Qb[m+4:m+1] of the flip-flops 121_1 to 121_4. The combinational logic circuit 122b may include a logic gate XOR1 that performs an exclusive OR (XOR) operation on the inverted output signals Qb[m+1] and Qb[m+2]. An output signal of the logic gate XOR1 may be transmitted to the input port "D" of the flip-flop 121_2. The combinational logic circuit 122b may include a logic gate NOR1 that performs a NOR operation on the inverted output signals Qb[m+1] and Qb[m+2]. The combinational logic circuit 122b may include a logic gate XOR2 that performs an XOR operation on the output signal of the logic gate NOR1 and the inverted output signal Qb[m+3]. An output signal of the logic gate XOR2 may be transmitted to the input port "D" of the flip-flop 121_3. The combinational logic circuit 122b may include a logic gate NOR2 that performs a NOR operation on the inverted output signals Qb[m+1] and Qb[m+2]. The combinational logic circuit 122b may include a logic gate NOR3 that performs a NOR operation on the output signal of the logic gate NOR2 and the inverted output signal Qb[m+3]. The combinational logic circuit 122b may include a logic gate XOR3 that performs an XOR operation on the output signal of the logic gate NOR3 and the inverted output signal Qb[m+4]. An output signal of the logic gate XOR3 may be transmitted to the input port "D" of the flip-flop 121_4. The logical operations performed by the combinational logic circuit 122b and the logic gates included in the combinational logic circuit 122b are only exemplary.

The synchronous counter 120b may have a critical path that starts from the inverted output port Qb of the flip-flop 121_1, passes through the combinational logic circuit 122b, and ends at the input port "D" of the flip-flop 121_4 through. The critical path of the synchronous counter 120b may become longer as "n" increases. When "n" is 4, the critical path may correspond to a path that starts from the inverted output port Qb of the flip-flop 121_1, passes through the logic gates NOR2, NOR3, and XOR3 of the combinational logic circuit 122b, and ends at the input port "D" of the flip-flop 121_4. A propagation delay of the critical path may correspond to a time necessary to propagate the inverted output signal Qb[m+1] output through the inverted output port Qb of the flip-flop 121_1 to the input port "D" of the flip-flop 121_4 through the logic gates NOR2, NOR3, and XOR3 of the combinational logic circuit 122b.

The synchronous counter 120b may receive the clock signal CK2 that is a result of dividing the clock signal CK1 by the asynchronous counter 110. A speed of the clock signal CK2 may be lower than a speed of the clock signal CK1. The clock signal CK2 may have a frequency lower than the clock signal CK1 and may have a period greater than the clock signal CK1. The synchronous counter 120b may operate based on the clock signal CK2. For example, the period of the clock signal CK2 may be the same as or greater than a sum of the CK-Q delay of the flip-flop 121_1, the propagation delay of the critical path, and a set-up time of the flip-flop 121_4. Here, "m" being the number of code bits CODE[m:1] that the asynchronous counter 110 outputs may be determined depending on the propagation delay of the critical path of the synchronous counter 120b. For example, when the period of the clock signal CK1 is "P", "P×m" may be the same as or greater than the propagation delay of the critical path.

The code generator 100 may solve a restriction on a frequency of a clock signal due to a critical path by using a hybrid counter including both the asynchronous counter 110 and the synchronous counter 120. Also, the code generator 100 may synchronously output the code bits CODE[m+n:1] by using both the delay circuits 113_1 to 113_m of the asynchronous counter 110 and the synchronous counter 120. Compared to the case of using only the asynchronous counter 110, the code generator 100 may include or use delay circuits, the number of which is less than the number of the delay circuits 113_1 to 113_m. Even though the number of code bits CODE[m+n:1] increases, the code generator 100 may adjust times, at which the code bits CODE[m+n:1] are output, to be the same, by using the hybrid counter.

Figure 9:
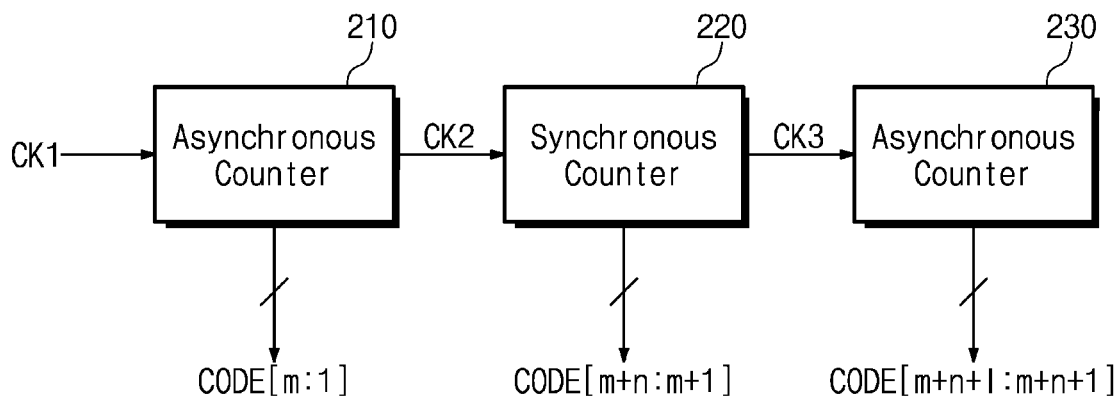
FIG. 9 illustrates a block diagram of a code generator according to example embodiments of the inventive concept.

FIG. 9 illustrates a block diagram of a code generator according to example embodiments of the inventive concept. A difference between the code generator 100 and a code generator 200 will be mainly described. The code generator 200 may include an asynchronous counter "210", a synchronous counter 220, and an asynchronous counter 230. The asynchronous counter 210 and the synchronous counter 220 may be substantially the same as the asynchronous counter and the synchronous counter described with reference to FIGS. 1, 2A to 2C, 3, 5, 7, and 8.

The asynchronous counter 230 may receive a clock signal CK3 and may output or generate code bits CODE[m+n+1:m+n+1] based on the clock signal CK3. For example, "1" may be an integer of 2 or more, "m" and "n" may be equal or different, and the asynchronous counter 230 may output multiple bits. The code bits CODE[m+n+1:m+n+1] may be upper bits compared with the code bits CODE[m+n:1]. The asynchronous counter 230 may operate substantially the same as the asynchronous counter 210 except for receiving the clock signal CK3. The clock signal CK3 may be the same as the clock signal CK2 or may correspond to a clock signal obtained by buffering the clock signal CK2.

Figure 10:
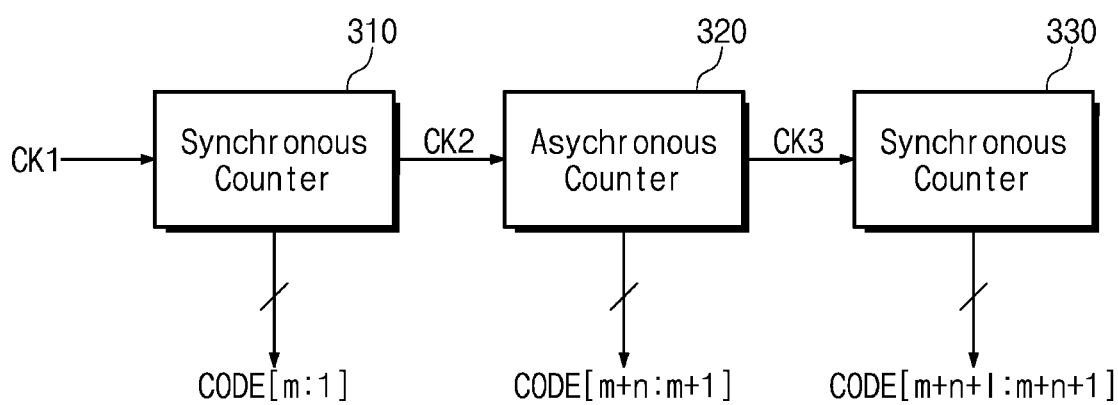
FIG. 10 illustrates a block diagram of a code generator according to example embodiments of the inventive concept.

FIG. 10 illustrates a block diagram of a code generator according to example embodiments of the inventive concept. A difference between the code generator 100 and a code generator 300 will be mainly described. The code generator 300 may include a synchronous counter 310, an asynchronous counter 320, and a synchronous counter 330. The asynchronous counter 320 and the synchronous counter 330 may be substantially the same as the asynchronous counter and the synchronous counter described with reference to FIGS. 1, 2A to 2C, 3, 5, 7, and 8. The synchronous counter 310 may operate substantially the same as the synchronous counter 330 except for receiving the clock signal CK1.

The synchronous counter 310 may receive the clock signal CK1 and may output or generate the code bits CODE[m:1] based on the clock signal CK1. The asynchronous counter 320 may receive the clock signal CK2 and may output or generate the code bits CODE[m+n:m+1] based on the clock signal CK2. The clock signal CK2 may be the same as the clock signal CK1 or may correspond to a clock signal obtained by buffering the clock signal CK1. The synchronous counter 330 may receive the clock signal CK3 and may output or generate the code bits CODE[m+n+1:m+n+1] based on the clock signal CK3. The clock signal CK3 may correspond to a signal that is obtained by dividing the clock signal CK2 by the asynchronous counter 320. In FIG. 10, "m", "n", and "1" may be an integer of 2 or more and may be equal or different.

Figure 11:
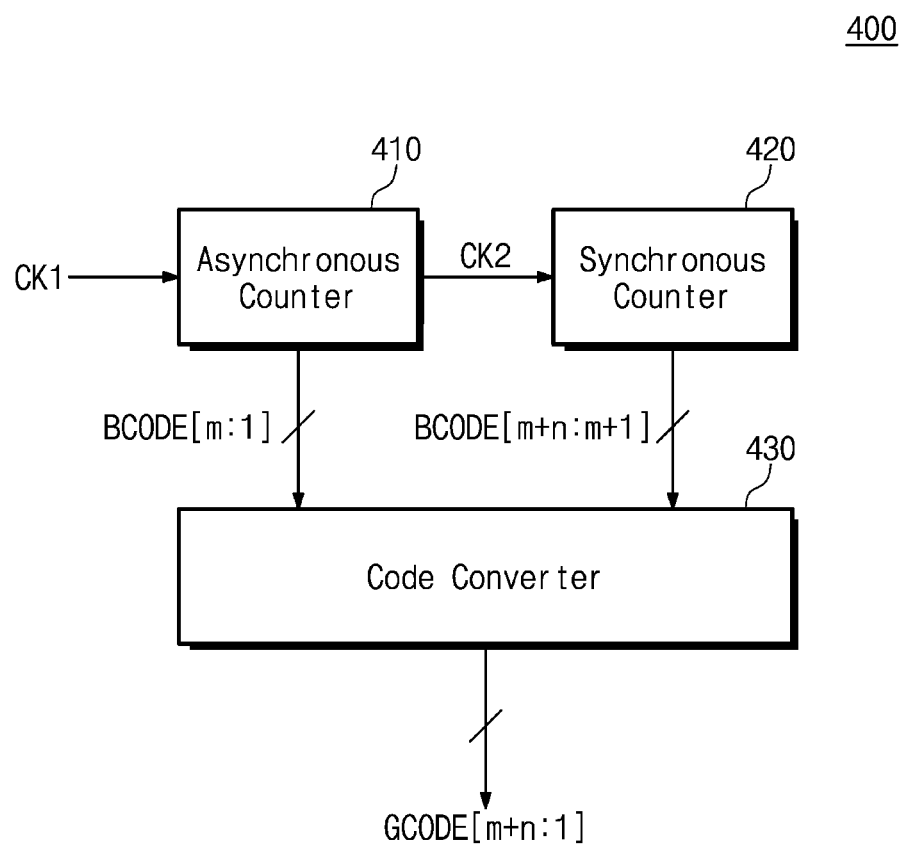
FIG. 11 illustrates a block diagram of a code generator according to example embodiments of the inventive concept.

FIG. 11 illustrates a block diagram of a code generator according to example embodiments of the inventive concept. A difference between the code generator 100 and a code generator 400 will be mainly described.

The code generator 400 may include an asynchronous counter 410, a synchronous counter 420, and a code converter 430. The asynchronous counter 410 and the synchronous counter 420 may be substantially the same as the asynchronous counter and the synchronous counter described with reference to FIGS. 1, 2A to 2C, 3, 5, 7, and 8. The code converter 430 may convert a binary code BCODE into a gray code GCODE. Binary code bits BCODE[m+n:1] may be the same as the code bits CODE[m+n:1] described with reference to FIGS. 1, 2A to 2C, 3, 5, 7, and 8. For example, the code generator 400 may output the binary code BCODE, may output the gray code GCODE, or may output both the binary code BCODE and the gray code GCODE.

Figure 12:
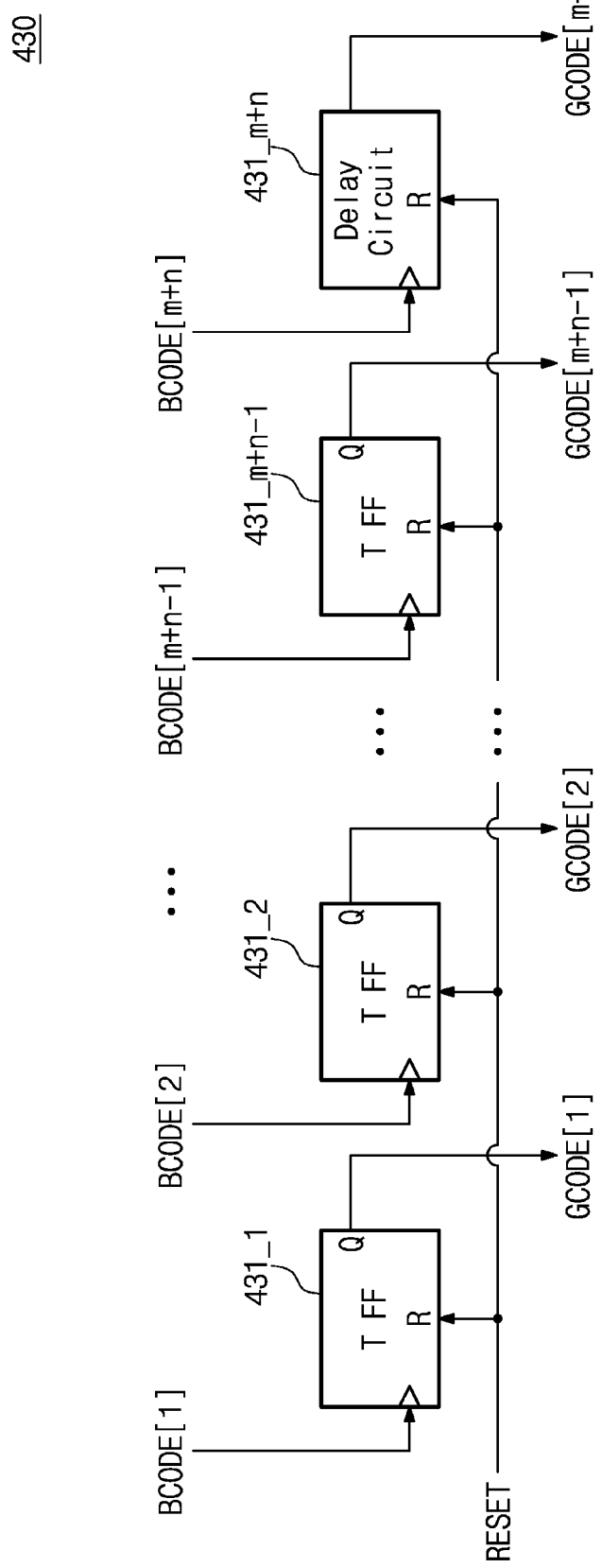
FIG. 12 illustrates a block diagram of a code converter of FIG. 11 according to example embodiments.

FIG. 12 illustrates a block diagram of a code converter of FIG. 11 according to example embodiments. The code converter 430 may include flip-flops 431_1 to 431_$m$+n−1 and a delay circuit 431_$m$+n. Each of the flip-flops 431_1 to 431_$m$+n−1 may include a clock port, a reset port "R", and an output port "Q". Each of the flip-flops 431_1 to 431_$m$+n−1 may further include an input port and an inverted output port (not illustrated). The inverted output port of each of the flip-flops 431_1 to 431_$m$+n−1 may be electrically connected to the input port thereof. For example, each of the flip-flops 431_1 to 431_$m$+n−1 may be the above-described T flip-flop. The flip-flops 431_1 to 431_$m$+n−1 may receive clock signals (or output signals of the asynchronous counter 410 and the synchronous counter 420) having the binary code bits BCODE[m+n−1:1] through the clock ports. The binary code bits BCODE[m+n−1:1] that the flip-flops 431_1 to 431_$m$+n−1 receive may not include an MSB BCODE[m+n] of all the binary code bits BCODE[m+n:1]. The flip-flops 431_1 to 431_$m$+n−1 may toggle logical values of gray code bits GCODE[m+n:1] at edges of the clock signals. For example, the flip-flops 431_1 to 431_$m$+n−1 may be implemented to be identical to each other.

The delay circuit 431_$m$+n may receive the binary code bit BCODE[m+n] as a clock signal and may output the received clock signal as the gray code bit GCODE[m+n] without modification. The delay circuit 431_$m$+n may be a replica circuit that is implemented by replicating one of the flip-flops 431_1 to 431_$m$+n−1. The delay circuit 431_$m$+n may delay the received clock signal as much as a CK-Q delay of each of the flip-flops 431_1 to 431_$m$+n−1. For example, the binary code bit BCODE[m+n] and the gray code bit GCODE[m+n] may be the same and may correspond to the MSBs of the binary code BCODE and the gray code GCODE.

The flip-flops 431_1 to 431_*m*+n−1 and the delay circuit 431_*m*+n may receive the reset signal RESET in common. A reset operation of the flip-flops 431_1 to 431_*m*+n−1 and the delay circuit 431_*m*+n may be the same as the reset operation described with reference to FIGS. 2A to 2C and 3. For example, the reset signal RESET may be provided to the asynchronous counter 410, the synchronous counter 420, and the code converter 430 in common. For another example, reset signals may be respectively provided to the asynchronous counter 410, the synchronous counter 420, and the code converter 430.

Figure 13:
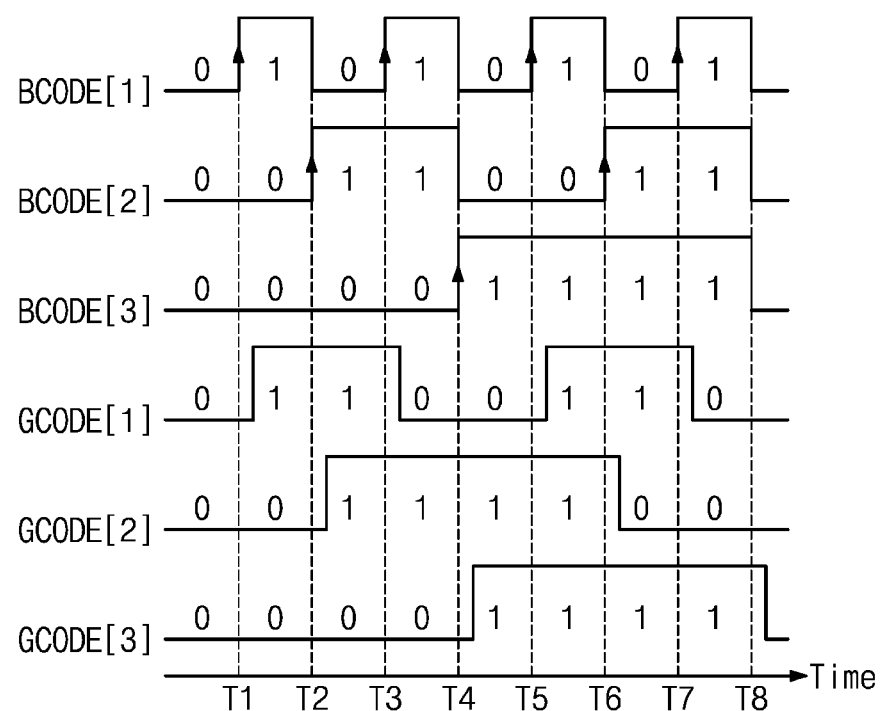
FIG. 13 is a timing diagram illustrating an operation of a code converter of FIGS. 11 and 12 according to example embodiments.

FIG. 13 is a timing diagram illustrating an operation of a code converter of FIGS. 11 and 12 according to example embodiments. FIG. 13 will be described together with reference to FIGS. 11 and 12. Time points T1 to T8 of FIG. 13 are different from the time points T1 to T8 of FIGS. 4 and 6. In FIG. 13, for convenience of description, it is assumed that "m+n" is 3.

At a time point T1, a logical value of the binary code bit BCODE[1] may be toggled from 0 to 1. The flip-flop 431_1 of the code converter 430 may toggle a logical value of the gray code bit GCODE[1] from 0 to 1 at an edge (the time point T1) of an output signal having the binary code bit BCODE[1]. A time difference between the output time of the binary code bit BCODE[1] and the output time of the gray code bit GCODE[1] may correspond to a CK-Q delay of the flip-flop 431_1. Logical values of the remaining gray code bits GCODE[2] and GCODE[3] may be maintained. Values of the gray code bits GCODE[3:1] may be updated from $000_{(2)}$ to $001_{(2)}$ with respect to the time T1.

At a time point T2, a logical value of the binary code bit BCODE[2] may be toggled from 0 to 1. The flip-flop 431_2 of the code converter 430 may toggle a logical value of the gray code bit GCODE[2] from 0 to 1 at an edge (the time point T2) of an output signal having the binary code bit BCODE[2]. A time difference between the output time of the binary code bit BCODE[2] and the output time of the gray code bit GCODE[2] may correspond to a CK-Q delay of the flip-flop 431_2. Logical values of the remaining gray code bits GCODE[1] and GCODE[3] may be maintained. Values of the gray code bits GCODE[3:1] may be updated from $001_{(2)}$ to $011_{(2)}$ with respect to the time point T2.

An operation of the flip-flop 431_1 at a time point T3 may be the same as the operation of the flip-flop 431_1 at the time T1. Values of the gray code bits GCODE[3:1] may be updated from $011_{(2)}$ to $010_{(2)}$ with respect to the time point T3. At a time point T4, a logical value of the binary code bit BCODE[3] may be toggled from 0 to 1. The delay circuit 431_3 of the code converter 430 may output the binary code bit BCODE[3] as the gray code bit GCODE[3] without modification. A time difference between the output time of the binary code bit BCODE[3] and the output time of the gray code bit GCODE[3] may correspond to the CK-Q delay of each of the flip-flops 431_1 and 431_2 (i.e., a delay of the delay circuit 431_3). Logical values of the remaining gray code bits GCODE[1] and GCODE[2] may be maintained. Values of the gray code bits GCODE[3:1] may be updated from $010_{(2)}$ to $110_{(2)}$ with respect to the time point T4.

Operations of the code converter 430 at time points T5 to T8 are substantially the same as the operations of the code converter 430 at the time points T1 to T4. Values of the gray code bits GCODE[3:1] may be updated from $110_{(2)}$ to $111_{(2)}$ with respect to the time point T5. Values of the gray code bits GCODE[3:1] may be updated from $111_{(2)}$ to $101_{(2)}$ with respect to the time point T6. Values of the gray code bits GCODE[3:1] may be updated from $101_{(2)}$ to $100_{(2)}$ with respect to the time point T7. Values of the gray code bits GCODE[3:1] may be updated from $100_{(2)}$ to $000_{(2)}$ with respect to the time point T8.

Figure 14:
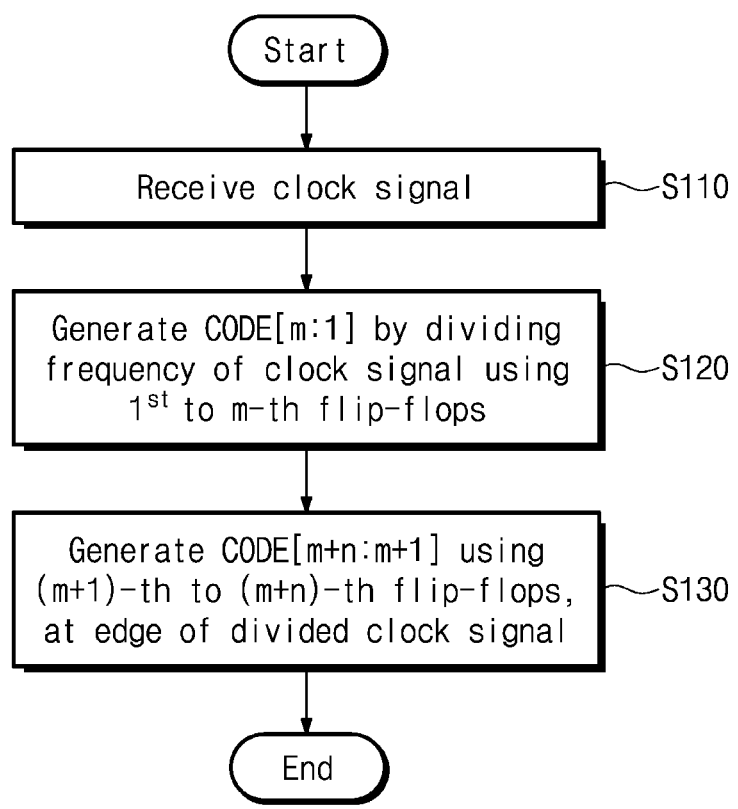
FIG. 14 illustrates a flowchart of a code generator according to example embodiments of the inventive concept.

FIG. 14 illustrates a flowchart of a code generator according to example embodiments of the inventive concept. The flowchart of FIG. 14 may be associated with the code generator 100 of FIG. 1. However, the flowchart of FIG. 14 may be also applied to the code generators 200, 300, and 400 of FIGS. 9, 10, and 11. FIG. 14 will be described with reference to FIGS. 1, 2A to 2C, and 3 to 13.

In operation S110, the code generator 100 may receive a clock signal. The clock signal may be the clock signal CK1 described with reference to FIG. 1. In operation S120, the asynchronous counter 110 of the code generator 100 may generate lower bits CODE[m:1] of a code by dividing the clock signal CK1 by using the flip-flops 111_1 to 111_*m*. In operation S130, the synchronous counter 120 of the code generator 100 may generate upper bits CODE[m+n:m+1] of the code by the flip-flops 121_1 to 121_*n* at an edge of the divided clock signal. The divided clock signal may be the clock signal CK2 described with reference to FIG. 1. For example, operation S130 may be performed after the clock signal is divided through operation S120. For example, in the case where the flowchart of FIG. 14 is applied to the code generator 400 of FIG. 11, after operation S130, the code generator 400 may convert a binary code generated through operation S120 and operation S130 into a gray code.

Figure 15:
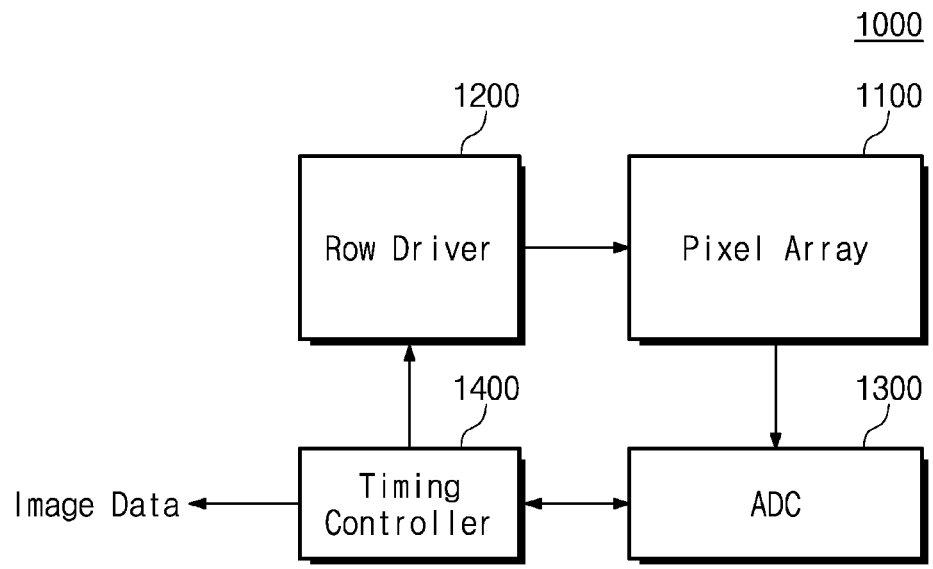
FIG. 15 illustrates a block diagram of an image sensor to which a code generator according to example embodiments of the inventive concept is applied.

FIG. 15 illustrates a block diagram of an image sensor to which a code generator according to example embodiments of the inventive concept is applied. An image sensor 1000 may include a pixel array 1100, a row driver 1200, an analog-to-digital converter (ADC) 1300, and a timing controller 1400. Although not illustrated in FIG. 15, the image sensor 1000 may further include a processor, which processes image data from the ADC 1300, such as an image signal processor (ISP). According to example embodiments, the components of the image sensor 1000 of FIG. 15 may include and use one of the code generators 100, 200, 300, and 400 disclosed herein.

The pixel array 1100 may include pixels (not illustrated) that are arranged in a row direction and a column direction and convert an incident light into an electrical signal. Under control of the timing controller 1400, the row driver 1200 may decode a row address and may select and control pixels corresponding to the row address. The row driver 1200 may transmit control signals to the selected pixels. Under control of the timing controller 1400, the ADC 1300 may generate a digital code corresponding to an output signal (e.g., an analog signal) output from the pixel array 1100. For example, the ADC 1300 may perform double sampling and holding on the output signal. The ADC 1300 may perform correlated double sampling. The ADC 1300 may convert a difference between levels of the double-sampled output signal into a digital code. The timing controller 1400 may control the row driver 1200 and the ADC 1300. The timing controller 1400 may receive image data from the ADC 1300. The timing controller 1400 may provide the external device with image data sensed by the image sensor 1000 in response to a request of the external device communicating with the image sensor 1000.

Figure 16:
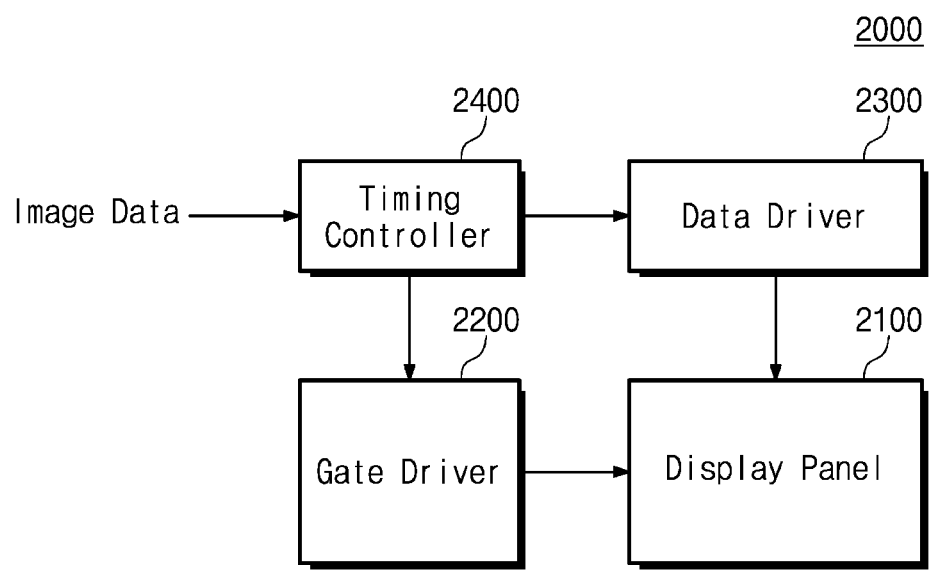
FIG. 16 illustrates a block diagram of a display device to which a code generator according to example embodiments of the inventive concept is applied.

FIG. 16 illustrates a block diagram of a display device to which a code generator according to example embodiments of the inventive concept is applied. A display device 2000 may include a display panel 2100, a gate driver 2200, a data driver 2300, and a timing controller 2400. According to example embodiments, the components of the display device 2000 of FIG. 16 may include and use one of the code generators 100, 200, 300, and 400 disclosed herein.

The display panel 2100 may display an image. The display panel 2100 may be implemented with a liquid crystal display (LCD) panel, a light emitting diode (LED) display panel, an organic LED (OLED) panel, an active-matrix OLED (AMOLED) display panel, a flexible display panel, or the like. Alternatively, the display panel 2100 may be implemented with a flat display panel different in kind from the above-described display panels. The display panel 2100 may include pixels that are arranged in a row direction and a column direction and is driven by the gate driver 2200 and the data driver 2300 to display an image corresponding to pixel data.

The gate driver 2200 may drive gate lines (not illustrated) connected to the pixels of the display panel 2100 and may select pixels. The data driver 2300 may drive data lines connected to the pixels of the display panel 2100. The data driver 2300 may transmit gray voltages corresponding to the pixel data to the pixels. For example, a pixel may include a thin film transistor, and a liquid crystal capacitor and a storage capacitor connected to a drain electrode of the thin film transistor. The gray voltage may be applied to the capacitors of the pixel.

The timing controller 2400 may receive pixel data (or image data) from an external device communicating with the display device 2000. The timing controller 2400 may control the gate driver 2200 and the data driver 2300.

Figure 17:
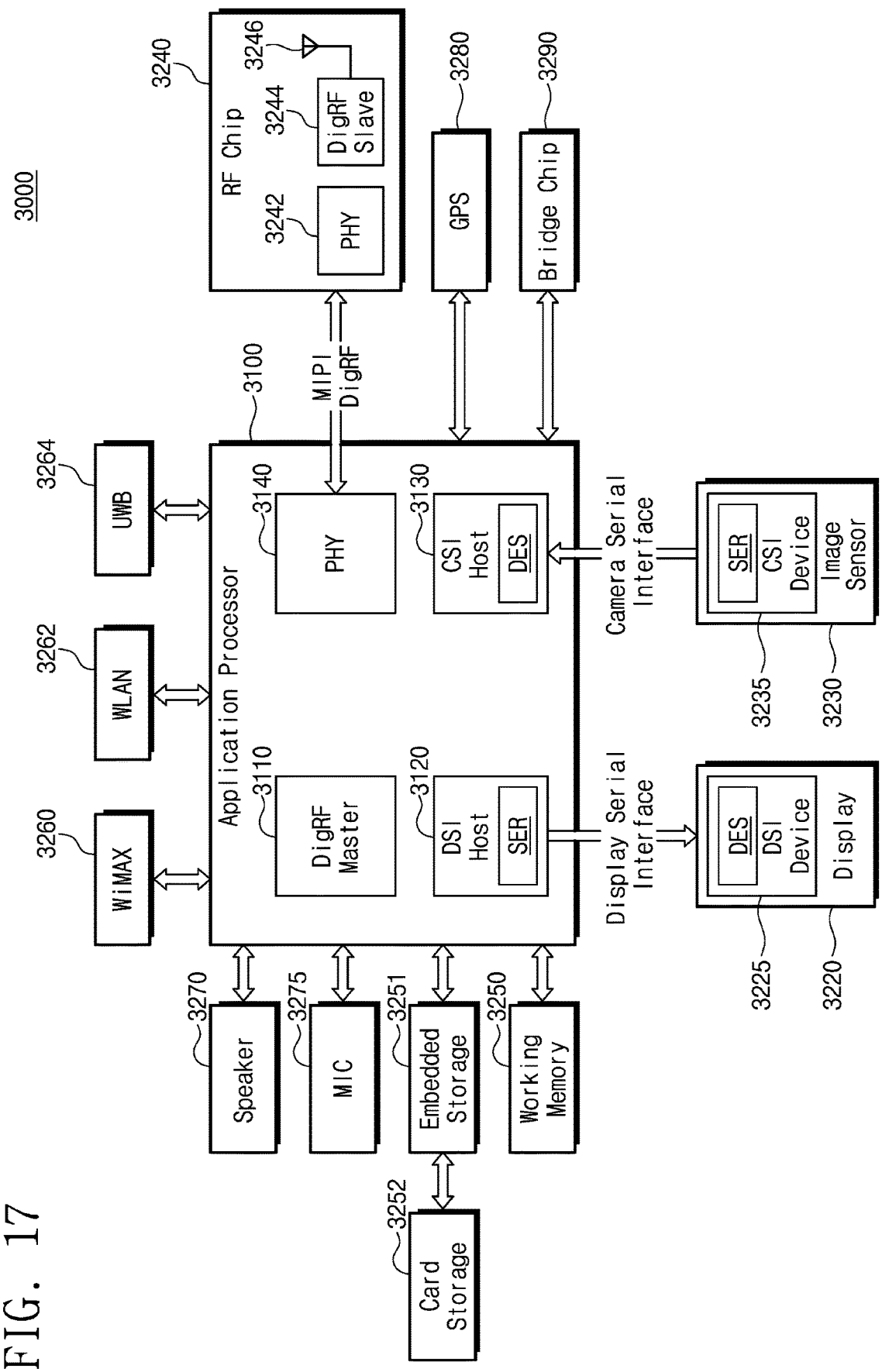
FIG. 17 illustrates a block diagram of an electronic device to which a code generator according to example embodiments of the inventive concept is applied.

FIG. 17 illustrates a block diagram of an electronic device to which a code generator according to example embodiments of the inventive concept is applied. An electronic device 3000 may be implemented with a data processing device capable of using or supporting an interface protocol proposed by mobile industry processor interface (MIPI) alliance and may be referred to as a "computer system". For example, the electronic device 3000 may be one of electronic devices such as a portable communication terminal, a personal digital assistant (PDA), a portable media player (PMP), a smartphone, a tablet computer, and a wearable device. According to example embodiments, the components of the electronic device 3000 of FIG. 17 may include and use one of the code generators 100, 200, 300, and 400 disclosed herein.

The electronic device 3000 may include an application processor 3100, a display 3220, and an image sensor 3230. The application processor 3100 may include a DigRF master 3110, a display serial interface (DSI) host 3120, a camera serial interface (CSI) host 3130, and a physical layer 3140.

The DSI host 3120 may communicate with a DSI device 3225 of the display 3220 in compliance with the DSI. For example, a serializer SER may be implemented in the DSI host 3120, and a deserializer DES may be implemented in the DSI device 3225. The CSI host 3130 may communicate with a CSI device 3235 of the image sensor 3230 through the CSI. For example, a deserializer DES may be implemented in the CSI host 3130, and a serializer SER may be implemented in the CSI device 3235. The electronic device 3000 may further include a radio frequency (RF) chip 3240 that communicates with the application processor 3100. The RF chip 3240 may include a physical layer 3242, a DigRF slave 3244, and an antenna 3246. For example, the physical layer 3242 of the RF chip 3240 and the physical layer 3140 of the application processor 3100 may exchange data with each other through the DigRF interface offered by the MIPI alliance.

The electronic device 3000 may further include a working memory 3250, an embedded storage device 3251, and a card storage device 3252. The working memory 3250, the embedded storage device 3251, and the card storage device 3252 may store or output data for the purpose of the application processor 3100. The working memory 3250 may temporarily store data processed or to be processed by the application processor 3100. The working memory 3250 may include a volatile memory such as a static random access memory (SRAM), a dynamic RAM (DRAM), or a synchronous DRAM (SDRAM), and/or a nonvolatile memory such as a flash memory, a phase-change RAM (PRAM), a magneto-resistive RAM (MRAM), a resistive RAM (ReRAM), or a ferro-electric RAM (FRAM). The embedded storage device 3251 and the card storage device 3252 may store data regardless of whether they are powered. The electronic device 3000 may communicate with an external device/system through a communication module that is based on a worldwide interoperability for microwave access (WiMAX) 3260, a wireless local area network (WLAN) 3262, or an ultra-wideband (UWB) 3264. In addition, the electronic device 3000 may communicate with the external device/system based on at least one of various wireless communication protocols, such as long term evolution (LTE), global system for mobile communication (GSM), code division multiple access (CDMA), Bluetooth, near field communication (NFC), wireless fidelity (Wi-Fi), and radio frequency identification (RFID) and/or various wired communication protocols, such as transfer control protocol/Internet protocol (TCP/IP), USB, SCSI, mobile PCIe (M-PCIe), and Firewire. The electronic device 3000 may further include a speaker 3270 and a microphone 3275 for the purpose of processing voice information. In addition, the electronic device 3000 may further include a global positioning system (GPS) device 3280 for processing position information. The electronic device 3000 may further include a bridge chip 3290 for managing connection with peripheral devices.

A code generator according to an embodiment of the inventive concept may output a code by using a hybrid counter including an asynchronous counter and a synchronous counter. The code generator may solve a restriction on a frequency of a clock signal due to the synchronous counter and a variation in a code output due to the asynchronous counter. Accordingly, the code generator may operate even under the following conditions: a high speed and a low power supply voltage.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:
1. A code generator comprising:
an asynchronous counter including first to m-th flip-flops configured to asynchronously output first to m-th output signals corresponding to first to m-th bits (m being an integer of 2 or more) of a code, respectively; and
a synchronous counter including (m+1)-th to (m+n)-th flip-flops configured to synchronously output (m+1)-th to (m+n)-th output signals corresponding to (m+1)-th to (m+n)-th bits (n being an integer of 2 or more) of the code,
wherein the asynchronous counter further includes first to m-th delay circuits configured to respectively delay the first to m-th output signals such that the first to m-th bits of the code are output together at the same time when the (m+1)-th to (m+n)-th bits are output.

2. The code generator of claim 1, wherein the first flip-flop of the asynchronous counter is further configured to receive a first clock signal,
wherein the second to m-th flip-flops of the asynchronous counter are further configured to receive inverted signals of the first to (m−1)-th output signals, respectively, and
wherein each of the (m+1)-th to (m+n)-th flip-flops of the synchronous counter is further configured to receive an inverted signal of the m-th output signal as a second clock signal.

3. The code generator of claim 2, wherein the first flip-flop of the asynchronous counter is further configured to toggle a logical value of the first bit of the code at an edge of the first clock signal, and
wherein the m-th flip-flop of the asynchronous counter is further configured to toggle a logical value of the m-th bit of the code at an edge of the (m−1)-th output signal.

4. The code generator of claim 1, wherein delay times of the first to m-th output signals delayed by the first to m-th delay circuits are different from each other.

5. The code generator of claim 1, wherein the (m+1)-th flip-flop of the synchronous counter is further configured to toggle a logical value of the (m+1)-th bit of the code at an edge of the m-th output signal, and
wherein the (m+2)-th to (m+n)-th flip-flops of the synchronous counter are further configured to latch logical values of the (m+2)-th to (m+n)-th bits of the code at the edge of the m-th output signal, respectively.

6. The code generator of claim 1, wherein the first to m-th flip-flops of the asynchronous counter and the (m+1)-th flip-flop of the synchronous counter are implemented to be the same as each other.

7. The code generator of claim 1, wherein the synchronous counter further includes a combinational logic circuit configured to perform logical operations on the (m+1)-th to (m+n)-th output signals, and
wherein a period of the m-th output signal is greater than a propagation delay of the combinational logic circuit.

8. The code generator of claim 1, wherein the asynchronous counter further includes a driver configured to drive the m-th output signal to be transmitted to the (m+1)-th to (m+n)-th flip-flops of the synchronous counter.

9. The code generator of claim 1, wherein the code is a binary code, and
wherein the first to m-th bits output by the asynchronous counter are lower bits of the binary code, and the (m+1)-th to (m+n)-th bits output by the synchronous counter are upper bits of the binary code.

10. The code generator of claim 1, wherein the first flip-flop of the asynchronous counter is configured to receive a clock signal and not to receive an inverted signal of the clock signal.

11. A code generator comprising:
an asynchronous counter configured to receive a first clock signal and to respectively output first output signals corresponding to first bits of a binary code based on the first clock signal;
a synchronous counter configured to respectively output second output signals corresponding to second bits of the binary code based on a second clock signal obtained by dividing the first clock signal by the asynchronous counter; and
a code converter configured to receive the first and second bits of the binary code and to convert the binary code into a gray code,
wherein the code converter includes:
a plurality of first flip-flops configured to toggle logical values of remaining logical values of the gray code other than the most significant bit (MSB) of the binary code at edges of output signals respectively corresponding to remaining bits of the first and second bits other than the MSB of the binary code, and
a delay circuit configured to delay an output signal corresponding to the MSB of the binary code and to output the MSB of the gray code.

12. The code generator of claim 11, wherein each of the plurality of first flip-flops includes a clock port receiving each of the first and second output signals, an output port outputting each of the logical values, an inverted output port outputting each of inverted values of logical values, and an input port electrically connected to the inverted output port.

13. The code generator of claim 11, wherein the asynchronous counter includes a plurality of second flip-flops configured to asynchronously output the first bits of the binary code based on the first clock signal, and
wherein the synchronous counter includes a plurality of third flip-flops configured to synchronously output the second bits of the binary code based on the second clock signal.

14. The code generator of claim 11, wherein the asynchronous counter includes:
a plurality of second flip-flops configured to asynchronously output the first output signals based on the first clock signal; and
a plurality of delay circuits configured to respectively delay the first output signals and to synchronously output the first bits of the binary code, and
wherein the synchronous counter includes a plurality of third flip-flops configured to synchronously output the second output signals corresponding to the second bits of the binary code based on the second clock signal.

15. An operating method of a code generator, the method comprising:
receiving a first clock signal;
outputting a first output signal based on the first clock signal by using a first flip-flop;
outputting second to m-th output signals by dividing a frequency of the first clock signal by using second to m-th flip-flops (m being an integer of 2 or more);
delaying the first to m-th output signals corresponding to first to m-th bits of a code by first to m-th delay circuit, respectively; and
synchronously outputting (m+1)-th to (m+n)-th output signals (n being an integer of 2 or more) corresponding to (m+1)-th to (m+n)-th bits of the code by using (m+1)-th to (m+n)-th flip-flops, at an edge of a second clock signal generated by dividing the first clock signal by using the first to m-th flip-flops.

16. The method of claim 15, wherein the outputting of the second to m-th output signals includes:
outputting the second output signal of the second flip-flop at an edge of the first output signal of the first flip-flop; and
outputting the m-th output signal, at an edge of the (m−1)-th output signal of the (m−1)-th flip-flop after the edge of the first clock signal.

17. The method of claim 15, wherein the first to m-th output signals are sequentially output, and
wherein the (m+1)-th to (m+n)-th output signals are simultaneously output.

18. The method of claim 15, wherein the (m+1)-th to (m+n)-th output signals are output after the first to m-th output signals are output.

19. The method of claim 15, further comprising:
converting the code into a gray code by using a code converter,
wherein the code is a binary code.

* * * * *